(12) United States Patent
Chen et al.

(10) Patent No.: US 11,793,003 B2
(45) Date of Patent: Oct. 17, 2023

(54) SEMICONDUCTOR STRUCTURE WITH EMBEDDED MEMORY DEVICE

(71) Applicant: Taiwan Semiconductor Manufacturing Co., Ltd., Hsinch (TW)

(72) Inventors: Huang-Kui Chen, Hsinchu (TW); Guan-Jie Shen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/926,239

(22) Filed: Jul. 10, 2020

(65) Prior Publication Data

US 2022/0013582 A1  Jan. 13, 2022

(51) Int. Cl.
*H01L 23/528* (2006.01)
*H10B 63/00* (2023.01)
*H10N 70/00* (2023.01)
*H10N 70/20* (2023.01)

(52) U.S. Cl.
CPC ........... *H10B 63/34* (2023.02); *H01L 23/528* (2013.01); *H10N 70/021* (2023.02); *H10N 70/253* (2023.02)

(58) Field of Classification Search
CPC .............. H01L 27/2454; H01L 23/528; H01L 45/1206; H01L 45/1608
See application file for complete search history.

(56) References Cited

U.S. PATENT DOCUMENTS

| | | | |
|---|---|---|---|
| 2002/0140060 A1* | 10/2002 | Asao | G11C 11/161 257/E27.005 |
| 2016/0172420 A1* | 6/2016 | Bajaj | H01L 45/06 365/148 |
| 2018/0151799 A1 | 5/2018 | Chou et al. | |
| 2019/0058007 A1* | 2/2019 | Tsai | G11C 11/1659 |
| 2019/0123269 A1 | 4/2019 | Mo et al. | |
| 2020/0006656 A1* | 1/2020 | Leobandung | H01L 27/2436 |
| 2020/0052207 A1 | 2/2020 | Ando et al. | |
| 2020/0075860 A1* | 3/2020 | Ando | H01L 45/1253 |
| 2020/0303623 A1* | 9/2020 | Wiegand | H01L 45/1266 |

FOREIGN PATENT DOCUMENTS

CN   113394243 A   9/2021

OTHER PUBLICATIONS

European Search Report and Opinion directed to related European Application No. 21184741.3, dated Nov. 25, 2021; 5 pages.

* cited by examiner

*Primary Examiner* — Fernando L Toledo
*Assistant Examiner* — Neil R Prasad
(74) *Attorney, Agent, or Firm* — Sterne, Kessler, Goldstein & Fox P.L.L.C.

(57) ABSTRACT

The present disclosure describes a semiconductor structure and a method for forming the same. The semiconductor structure can include a substrate, a gate structure over the substrate, a source/drain (S/D) contact structure adjacent to the gate structure, a layer of dielectric material over the S/D contact structure, a conductor layer over and in contact with the layer of dielectric material and above the S/D contact structure, and an interconnect structure over and in contact with the conductor layer.

20 Claims, 16 Drawing Sheets

SEMICONDUCTOR STRUCTURE WITH EMBEDDED MEMORY DEVICE

BACKGROUND

In integrated circuits, resistive random-access memory (RRAM) structures can be formed in the back end of the line (BEOL) between layers of interconnect structures (e.g., lines and vias) filled with a metal (e.g., copper) or a metal alloy (e.g., copper alloy). As the line and via pitch in the interconnect layers scaling down with each technology generation (e.g., node), the space between the RRAM structures is also reduced. Such scaling down has increased the complexity of semiconductor device manufacturing processes.

BRIEF DESCRIPTION OF THE DRAWINGS

Aspects of this disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1A:
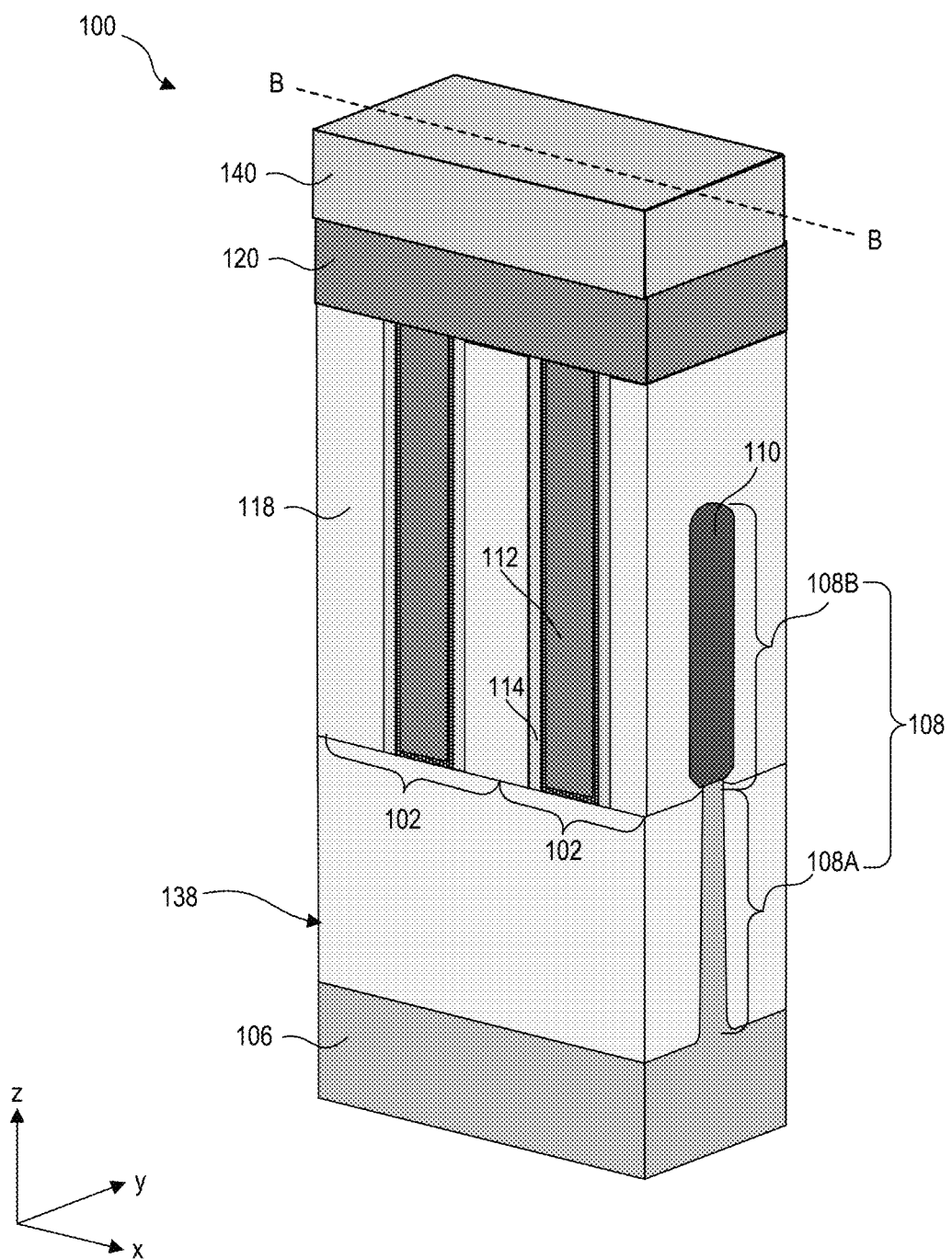
FIG. 1A illustrates an isometric view of a semiconductor device, according to some embodiments.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

As used herein, the term "vertical" means nominally perpendicular to the surface of a substrate.

Fins associated with fin field effect transistors (finFETs) or gate-all-around (GAA) FETs may be patterned by any suitable method. For example, the fins may be patterned using one or more photolithography processes, including a double-patterning process or a multi-patterning process. Double-patterning and multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Resistive random-access memory (RRAM) is a non-volatile type of memory. An RRAM cell can store a bit of data using resistance, rather than electric charge. More specifically, the RRAM cell includes a resistive material layer, the resistance of which can be adjusted to represent a logic "0" or a logic "1." RRAMs operate under the principle that a dielectric material can be manufactured to conduct current via a "filament" or a conduction path formed after the application of a voltage across a pair of electrodes that surrounds the dielectric material. The conduction path can arise from different mechanisms, including vacancies in the dielectric material, metal defect migration, and/or other mechanisms. The formation of the filament, or the conduction path, is part of the "forming operation" or formation process (e.g., programing) of the RRAM cell. Once the filament or the conduction path is established, it may be reset ("broken," resulting in a higher resistance) or set ("reformed," resulting in a lower resistance) by another voltage. The low-resistance path can be either localized (e.g., limited to the area of the filament) or homogeneous (e.g., throughout the dielectric between the two electrodes).

An RRAM structure can be integrated with (e.g., embedded in) a transistor structure in integrated circuits (ICs). For example, the RRAM structure can be inserted between the transistor's source/drain (S/D) structure and the S/D contact. However, the fabrication process that defines such RRAM structure can damage the underlying S/D structure and introduce thickness variations in the RRAM structure's resistive material. Accordingly, such RRAM structure (inserted between the S/D structure and the S/D metal contact) can have a low device reliability, thus degrading an overall performance of the IC.

The present disclosure is directed to a fabrication method and a transistor structure with an embedded RRAM structure. The transistor structure can include a gate structure, a pair of S/D structures formed at opposite sides of the gate structure, and a pair of S/D contacts respectively formed over the pair of S/D structures. The transistor structure can further include a layer of resistive material formed over the pair of S/D contacts. The RRAM structure can be integrated with the transistor structure by sandwiching the layer of resistive material with one of the pair of S/D contacts and a metal electrode formed over the layer of resistive material. Since the RRAM structure is separated from the pair of S/D structures, the pair of S/D structures can be free from structural damages during the fabrication of the RRAM structure. Further, the thickness of the RRAM structure is determined by the thickness of the layer of resistive material, which can be well-controlled by a blanket deposition process. Therefore, a benefit of the present disclosure, among others, is to improve the reliability and yield of the embedded RRAM structure, thus enhancing an overall reliability and performance of the IC.

A semiconductor device 100 having multiple field effect transistors (FETs) 102, a contact structure 120 disposed over FETs 102, and an interconnect structure 140 disposed over contact structure 120 is described with reference to FIGS. 1A-1H, according to some embodiments. FIG. 1A illustrates an isometric view of semiconductor device 100, according to some embodiments. FIGS. 1B-1E illustrate cross-sectional views along line B-B of semiconductor device 100 of FIG. 1A, according to some embodiments. FIGS. 1F-1H illustrate top views of semiconductor device 100, according to some embodiments. The discussion of elements in FIGS. 1A-1H with the same annotations applies to each other, unless mentioned otherwise. Semiconductor device 100 can be included in a microprocessor, memory cell, or other integrated circuit. Though FETs 102 shown in FIGS. 1A-1H are fin field effect transistors (finFETs), each FET 102 can be a gate-all-around (GAA) FET, according to some embodiments. In some embodiments, contact structure 120 can include a resistive random-access memory (RRAIVI) structure 125 (shown at FIGS. 1B-1E) connected with FET 102.

Figure 1B:
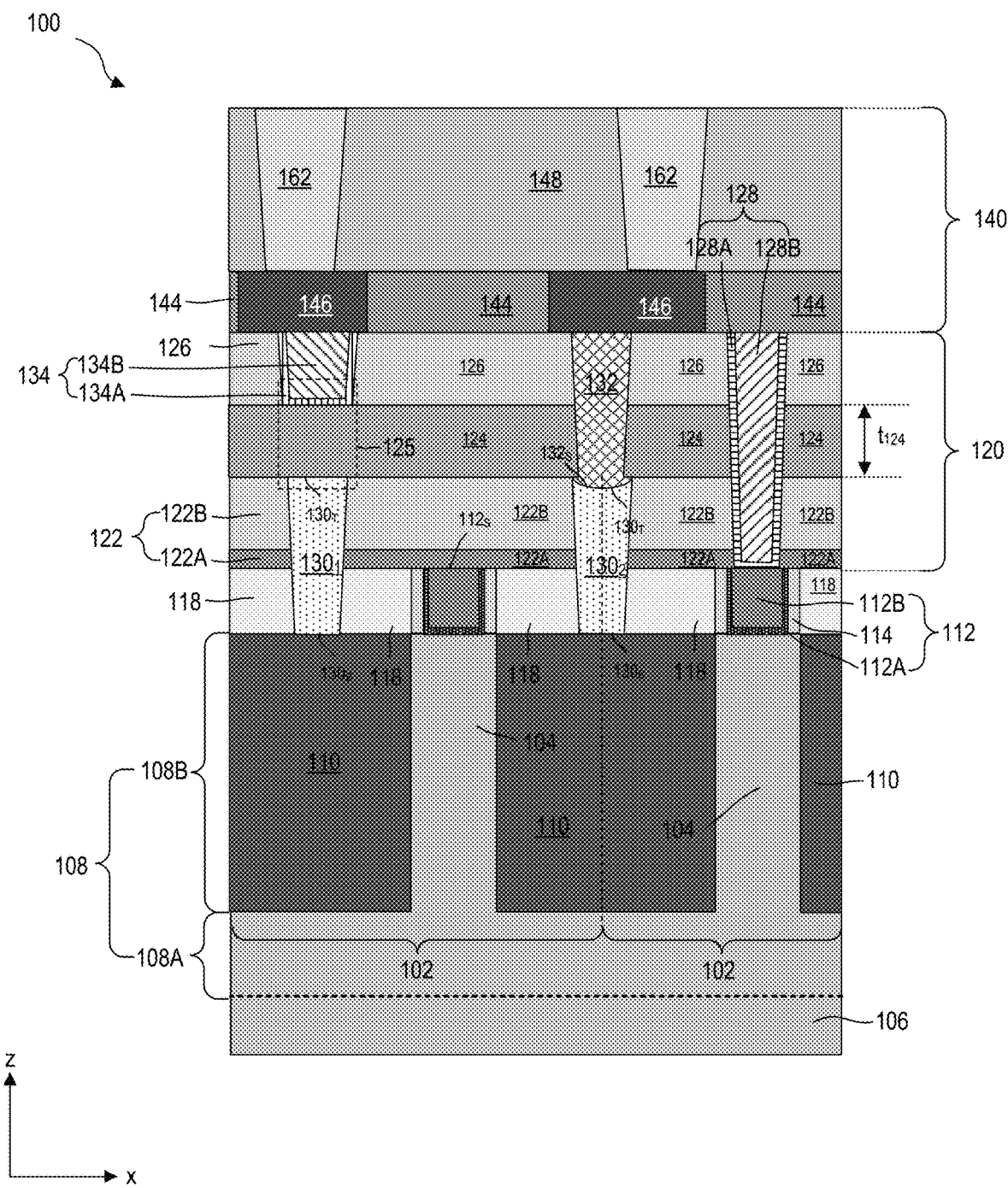
FIGS. 1B-1E illustrate cross-sectional views of a semiconductor device, according to some embodiments.

Referring to FIGS. 1A and 1B, each FET 102 can include a fin structure 108 extending along an x-direction, a gate structure 112 traversing through fin structure 108 along a y-direction, and a source/drain (S/D) region 110 formed over portions of fin structure 108. Although FIG. 1A shows fin structure 108 accommodating two FETs 102, any number of FETs 102 can be disposed along fin structure 108. Each FET 102 can be formed on a substrate 106. Substrate 106 can be a semiconductor material, such as silicon. In some embodiments, substrate 106 can include (i) an elementary semiconductor, such as silicon (Si) and germanium (Ge); (ii) a compound semiconductor including silicon carbide (SiC), gallium arsenide (GaAs), gallium phosphide (GaP), indium phosphide (InP), indium arsenide (InAs), and indium antimonide (InSb); or (iii) a combination thereof. Further, substrate 106 can be doped depending on design requirements (e.g., p-type substrate or n-type substrate). In some embodiments, substrate 106 can be doped with p-type dopants (e.g., boron (B), indium (In), aluminum (Al), or gallium (Ga)) or n-type dopants (e.g., phosphorus (P) or arsenic (As)).

Fin structure 108 can include a fin base portion 108A and a stacked fin portion 108B disposed on fin base portion 108A. Fin base portion 108A can include a material identical to or similar to substrate 106, such as a material having a lattice constant substantially close to (e.g., lattice mismatch within 5%) that of substrate 106. Stacked fin portion 108B can include a semiconductor layer functioning as FET 102's channel layer 104 and a S/D region 110 horizontally (e.g., in the x-direction) in contact with channel layer 104.

S/D region 110 can be grown over fin base portion 108A. Each of channel layers 104 of FET 102 can be interposed between a pair of S/D regions 110. S/D region 110 can include an epitaxially-grown semiconductor material. In some embodiments, the epitaxially-grown semiconductor material can be the same material as the material of substrate 106. For example, the epitaxially-grown semiconductor material can have a lattice constant substantially close to (e.g., lattice mismatch within 5%) that of the material of substrate 106. In some embodiments, the epitaxially-grown semiconductor material can include: (i) a semiconductor material, such as Ge and Si; (ii) a compound semiconductor material, such as GaAs and AlGaAs; or (iii) a semiconductor alloy, such as SiGe and GaAsP. S/D region 110 can be doped with p-type dopants or doped with n-type dopants. The p-type dopants can include B, In, Al, or Ga. The n-type dopants can include P or As.

Channel layer 104 can include semiconductor materials similar to substrate 106. For example, channel layer 104 can include a semiconductor material having lattice constant substantially close to (e.g., lattice mismatch within 5%) that of substrate 106. In some embodiments, channel layer 104 can include Si or SiGe. In some embodiments, channel layer 104 can include SiGe with a Ge concentration from about 25 atomic percent to about 50 atomic percent with any remaining atomic percent being Si or can include Si without any substantial amount of Ge. In some embodiments, channel layer 104 can be undoped, doped with p-type dopants or doped with n-type dopants. The p-type dopant can include B, In, Al, or Ga. The n-type dopant can include P or As.

Gate structure 112 can be multi-layered structures that wraps around portions of fin structure 108. For example, gate structure 112 can wrap FET 102's channel layers 104 (e.g., semiconductor layer) to modulate a conductivity of FET 102's channel layer 104. In some embodiments, gate structure 112 can be referred to as gate-all-around (GAA) structures, where FET 102 can be referred to as a GAA FET 102. Gate structure 112 can include a gate dielectric layer 112A, a gate electrode 112B disposed on gate dielectric layer 112A, and gate spacers 114 disposed on sidewalls of gate electrode 112B. Gate dielectric layer 112A can be wrapped around channel layer 104, hence electrically isolating channel layer 104 and gate electrode 112B. Gate dielectric layer 112A can be disposed between gate electrode 112B and S/D regions 110 to prevent electrical shorting in between.

Gate dielectric layer 112A can include any suitable dielectric material, such as (i) a layer of silicon oxide, silicon nitride, and/or silicon oxynitride, (ii) a high-k dielectric material that has a dielectric constant greater than the dielectric constant of silicon dioxide (e.g., greater than about 3.9), such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$), and (iii) a combination thereof, that separates gate electrode 112B from channel layer 104. In some embodiments, gate dielectric layer 112A can include a single layer or a stack of insulating material layers. Gate dielectric layer 112A can have a thickness ranging from about 1 nm to about 5 nm. Other materials and thicknesses for gate dielectric layers 112A are within the spirit and scope of this disclosure.

Gate electrode 112B can be a gate terminal of FET 102. Gate electrode 112B can include metal stacks that wrap about channel layer 104. In some embodiments, gate electrode 112B can include a gate barrier layer (not shown in FIGS. 1A and 1B), a gate work function layer (not shown in FIGS. 1A and 1B), and a gate metal fill layer (not shown in FIGS. 1A and 1B). The gate barrier layer can serve as a nucleation layer for subsequent formation of a gate work function layer. The gate barrier layer can include titanium (Ti), tantalum (Ta), titanium nitride (TiN), tantalum nitride (TaN), or other suitable diffusion barrier materials. The gate work function layer can include a single metal layer or a stack of metal layers. In some embodiments, the gate work function layer can include aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. Gate metal fill layer can include a single metal layer or a stack of metal layers. In some embodiments, the gate metal fill layer can include a suitable conductive material, such as Ti, silver (Ag), Al, titanium aluminum nitride (TiAlN), tantalum carbide (TaC), tantalum carbonitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and combinations thereof. Other materials for the gate barrier layer, the gate work function layer, and the gate metal fill layer are within the spirit and scope of this disclosure.

Gate spacer 114 can physically contact gate dielectric layers 112A. Gate spacer 114 can include a low-k material with a dielectric constant less than about 3.9. For example, gate spacer 114 can include insulating material, such as silicon oxide, silicon nitride, a low-k material, and a combination thereof. In some embodiments, gate spacer 114 can have a thickness ranging from about 2 nm to about 10 nm. Other materials and thicknesses for gate spacer 114 are within the spirit and scope of this disclosure.

Semiconductor device 100 can further include a shallow trench isolation (STI) regions 138 that provide electrical isolation for fin structure 108. For example, STI regions 138 can electrically isolate fin structure 108 from another fin structure 108 (not shown in FIG. 1A) formed in semiconductor device 100. Also, STI regions 138 can provide electrical isolation between FETs 102 and neighboring active and passive elements (not shown in FIG. 1A) integrated with or deposited on substrate 106. STI regions 138 can include one or more layers of dielectric material, such as a nitride layer, an oxide layer disposed on the nitride layer, and an insulating layer disposed on the nitride layer. In some embodiments, an insulating layer can refer to a layer that functions as an electrical insulator (e.g., a dielectric layer). In some embodiments, the insulating layer can include silicon oxide, silicon nitride, silicon oxynitride, fluorine-doped silicate glass (FSG), a low-k dielectric material, and/or other suitable insulating materials.

Semiconductor device 100 can further include an interlayer dielectric (ILD) layer 118 disposed over fin structure 108 to provide an electrical insulation between adjacent fin structures 108. In some embodiments, ILD layer 118 can provide an electrical insulation between S/D region 110 and contact structure 120. By way of example and not limitation, ILD layer 118 can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). In some embodiments, the dielectric material can be silicon oxide or silicon nitride. In some embodiments, ILD layer 118 can have a thickness from about 50 nm to about 200 nm. Other materials, thicknesses, and formation methods for ILD layer 118 are within the spirit and scope of this disclosure.

Referring to FIGS. 1A and 1B, contact structure 120 can be sandwiched between FET 102 and interconnect structure 140 to electrically connect FET 102 to interconnect structure 140. Contact structure 120 can include an ILD layer 122 disposed over ILD layer 118 and over gate structure 112. In some embodiments, ILD layer 122 can include an etch stop layer (ESL) 122A and a layer of dielectric material 122B that can have different etching selectivity from ESL 122A. In some embodiments, the term "etching selectivity" can refer to the ratio of the etch rates of two materials under the same etching conditions. Each of ESL 122A and layer of dielectric material 122B can be made of any suitable insulating material, such as silicon nitride, silicon oxynitride, and silicon oxide. Each of ESL 122A and layer of dielectric material 122B can have any suitable thickness, such as from about 50 nm to about 200 nm. Other materials and thicknesses for ILD layer 122, such as for ESL 122A and layer of dielectric material 122B, are within the spirit and scope of this disclosure.

Contact structure 120 can further include trench conductor layers 130 (e.g., trench conductor layer $130_1$ and trench conductor layer $130_2$) vertically (e.g., in the z-direction) extending through ILD layer 122 and over ILD layer 118 to contact S/D regions 110. In some embodiments, trench conductor layers 130 (e.g., trench conductor layer $130_1$ and trench conductor layer $130_2$) can represent FET 102's S/D contact structure that contacts FET 102's S/D regions 110. In some embodiments, trench conductor layer 130 (e.g., trench conductor layer $130_1$) can electrically bridge RRAM structure 125 and underlying S/D region 110. Trench conductor layer 130 can be made of any suitable conductive materials, such as Co, W, Al, Cu, Ti, Ta, Ru, Mo, a silicide material, and a conductive nitride material. In some embodiments, trench conductor layer 130 can be free from a conductive nitride material. In some embodiments, trench conductor layer 130 can include a layer of silicide material (not shown in FIGS. 1B-1E) in contact with S/D region 110 and one or more layers of conductive material (not shown in FIGS. 1B-1E) in contact with the layer of silicide material, where each of the one or more layers of conductive material can contact ILD 122 and/or ILD layer 118 (e.g., trench conductor layer 130 does not have a liner structure). Trench conductor layer 130 can have any suitable average horizontal dimension (e.g., width in the x-direction) and any suitable average vertical dimension (e.g., height in the z-direction) based on a pitch size of FET 102. For example, trench conductor layer 130 can have an average horizontal dimension (e.g., width in the x-direction) in a range from about 15 nm to about 50 nm and can have an average vertical dimension (e.g., height in the z-direction) in a range from about 100 nm to about 600 nm. In some embodiments, trench conductor layer 130 can have an aspect ratio (e.g., a ratio of height in the z-direction to width in the x-direction) greater than about 1, greater than about 3, or greater than about 5 based on a pitch size of FET 102. In some embodiments, trench conductor layer 130 can include slanted sidewalls, such that trench conductor layer 130's top surface $130_T$'s horizontal dimension (e.g., width in the x-direction) can be greater than trench conductor layer 130's bottom surface $130_s$'s horizontal dimension (e.g., width in the x-direction). In some embodiments, a trench conductor layer 130 (e.g., trench conductor layer $130_1$) can have a substantially planar top surface $130_T$, while another trench conductor layer 130 (e.g., trench conductor layer $130_2$) can have a curved or warped top surface $130_T$. In some embodiments, trench conductor layer 130's bottom surface $130_s$ can be vertically (in the z-direction) lower than gate structure 112's top surface $112_s$. Based on the disclosure herein, other materials and dimensions for trench conductor layer 130 are within the spirit and scope of this disclosure.

Contact structure 120 can further include a trench conductor layer 128 vertically (e.g., in the z-direction) extending through ILD layer 122 to contact gate structure 112. Trench conductor layer 128 can electrically bridge interconnect structure 140 and the underlying gate structure 112 (e.g., gate electrode 112B). In some embodiments, trench conductor layers 128 can represent FET 102's gate contact structure that contacts FET 102's gate structure 112. In some embodiments, trench conductor layer 128's bottom surface can be substantially coplanar with gate structure 112's top surface $112_s$, and therefore trench conductor layer 128's bottom surface can be vertically (e.g., in the z-direction) higher than trench conductor layer 130's bottom surface $130_s$. In some embodiments, trench conductor layer 128 can include a barrier liner layer 128A and a conductor layer 128B. In some embodiments, barrier liner layer 128A can include a metallic material (e.g., Ta or TiW), a metal oxide (e.g., alumina, manganese oxide, chromium oxide, niobium oxide, titanium oxide, or combinations thereof), a metal nitride (e.g., TaN or TiN), a metal compound (e.g., alumina, manganese oxide, chromium oxide, niobium oxide, titanium oxide, and/or combinations thereof), a carbon containing material, or combinations thereof. In some embodiments, conductor layer 128B can include Cu, Co, Ni, Ru, Rh, Ir, Os, Al, In, Ag, Au, W, or carbon nanotubes. In some embodiments, barrier liner layer 128A and a conductor layer 128B can be made of different material from trench conductor layer 130. For example, barrier liner layer 128A can be made of TiN, and conductor layer 128B can be made of W, while trench conductor layer 130 can be made of Co or Mo. In some embodiments, trench conductor layer 128 can be free from a silicide material (e.g., trench conductor layer 128 does not include the silicide material). Trench conductor layer 128 can have any suitable average horizontal dimension (e.g., width in the x-direction) and any suitable average vertical dimension (e.g., height in the z-direction) based on a pitch size of FET 102. For example, trench conductor layer 128 can have an average horizontal dimension (e.g., width in the x-direction) in a range from about 15 nm to about 50 nm and can have an average vertical dimension (e.g., height in the z-direction) in a range from about 100 nm to about 600 nm. In some embodiments, trench conductor layer 128 can have an aspect ratio greater than about 1, greater than about 3, or greater than about 5 based on a pitch size of FET 102. Based on the disclosure herein, other materials and dimensions for trench conductor layer 128 are within the spirit and scope of this disclosure.

Contact structure 120 can further include a layer of resistive material 124 disposed over trench conductor layers 130 and ESL 122A. Layer of resistive material 124 can be the resistive film for RRAM structure 125 to store a bit of data (e.g., logic "0" or logic "1"). Layer of resistive material 124 can include any dielectric material suitable for RRAM structure 125, such as a silicon-based nitride material (e.g., silicon nitride or silicon oxynitride), a silicon-based oxide material (e.g., silicon oxide), a metal-based nitride material (e.g., TiN, zirconium nitride, hafnium nitride, aluminum nitride, gallium nitride, or indium nitride), a metal-based oxide material (e.g., aluminum oxide, aluminum oxynitride, $HfO_2$, $TiO_2$, $HfZrO$, $Ta_2O_3$, $HfSiO_4$, $ZrO_2$, or $ZrSiO_2$), and a carbide material (e.g., silicon oxynitride carbide, silicon oxycarbide, silicon carbide, TaC, TiC, TiAlC, TaAlC, or TaCN). Layer of resistive material 124 can have a thickness $t_{124}$ from about 2 nm to about 30 nm or from about 5 nm to about 20 nm that is suitable for RRAM structure 125. If layer of resistive material 124's thickness $t_{124}$ is below the above noted lower limits, layer of resistive material 124 can exhibit an electrical breakdown to cause a leakage current for RRAM structure 125. On the other hand, if layer of resistive material 124's thickness $t_{124}$ is beyond the above noted upper limits, layer of resistive material 124 can exhibit an undesirable high resistivity (e.g., greater than 500 µΩ·cm) for RRAM structure 125. Contact structure 120 can further include a layer of dielectric material 126 disposed over layer of resistive material 124. Layer of dielectric material 126 and layer of resistive material 124 can separate trench conductor layers 130 from interconnect structure 140. In some embodiments, trench conductor layer 128 can be formed through layer of dielectric material 126 and layer of resistive material 124 to connect gate structure 112 with interconnect structure 140. Layer of dielectric material 126 can be made of any suitable insulating material, such as silicon nitride, silicon oxynitride, silicon oxide, and a high-k material. In some embodiments, layer of dielectric material 126 and layer of resistive material 124 can be made of same materials. In some embodiments, layer of dielectric material 126 and layer of resistive material 124 can be made of different materials having different etching selectivity from each other. In some embodiments, layer of dielectric material 126 can have a thickness greater than layer of resistive material 124's thickness $t_{124}$, because layer of dielectric material 126 needs to electrically insulate FET 102 from interconnect structure 140.

Contact structure 120 can further include a trench conductor layer 134 and a trench conductor layer 132 formed over a pair of trench conductor layers 130 (e.g., trench conductor layers $130_1$ and $130_2$), where the pair of trench conductor layers 130 can contact a pair of underlying S/D regions 110 formed at opposite sides to gate structure 112. As shown in FIG. 1B, trench conductor layer 134 can be formed over trench conductor layer $130_1$ and layer of resistive material 124. Further, trench conductor layer 134 can be formed separating from the underlying trench conductor layer $130_1$ by layer of resistive material 124. Accordingly, RRAM structure 125 can be defined by a layer of resistive material 124 sandwiched by two vertically (e.g., in the z-direction) opposite electrodes made by trench conductor layer $130_1$ and trench conductor layer 134. In some embodiments, trench conductor layer $130_1$ can be sealed by layer of resistive material 124 (e.g., trench conductor layer $130_1$ can be entirely covered by layer of resistive material 124), where trench conductor layer 134 can be formed horizontally (e.g., in the x-y plane) over layer of resistive material 124 and overlapping with trench conductor layer $130_1$ to define RRAM structure 125. In some embodiments, a ratio of trench conductor layer 134's area that horizontally (e.g., in the x-y plane) overlaps with trench conductor layer $130_1$ to trench conductor layer 134's total area can be from about 0.5 to about 1.0, from about 0.7 to about 1.0, from about 0.8 to about 1.0, or from about 0.9 to about 1.0 to define RRAM structure 125. The above noted lower limits can avoid layer of resistive material 124 from exhibiting an undesirable high resistivity (e.g., greater than 500 µΩ·cm) for RRAM structure 125. In some embodiments, gate structure 112 can be sealed by layer of resistive material 124 (e.g., gate electrode 112B can be entirely covered by layer of resistive material 124), where trench conductor layer 134 can be formed horizontally (e.g., in the x-y plane) over layer of resistive material 124 and overlapping with gate structure 112 to define RRAM structure 125 (e.g., RRAM structure 125 can be defined by a layer of resistive material 124 sandwiched by two vertically (e.g., in the z-direction) opposite electrodes made by gate electrode 112B and trench conductor layer 134; not shown in FIGS. 1A-1E). In some embodiments, a vertical (e.g., in the z-direction) separation between trench conductor layer 134 and the underlying trench conductor layer $130_1$ can be substantially equal to layer of resistive material 124's thickness $t_{124}$. In some embodiments, a vertical (e.g., in the z-direction) separation between trench conductor layer 134 and the underlying trench conductor layer $130_1$ can be from about 2 nm to about 30 nm or from about 5 nm to about 20 nm. If the separation between trench conductor layer 134 and underlying trench conductor layer $130_1$ is below the above noted lower limits, RRAM structure 125 can exhibit an electrical breakdown that causes a leakage current. On the other hand, if the separation between trench conductor layer 134 and underlying trench conductor layer $130_1$ is beyond the above noted upper limits, RRAM structure 125 can exhibit an undesirable high resistivity (e.g., greater than 500 µΩ·cm). In some embodiments, interconnect structure 140 can connect to FET 102 (e.g., FET 102's S/D region 110 underlying trench conductor layer $130_1$) through RRAM structure 125. In some embodiments, trench conductor layer 134 can be formed through layer of dielectric material 126 to contact layer of resistive material 124. In some embodiments, trench conductor layer 134 can be formed through layer of dielectric material 126, where trench conductor layer 134's bottom surface can be substantially coplanar with layer of resistive material 124's top surface. In some embodiments, trench conductor layer 134 can be formed through layer of dielectric material 126 and protruding into layer of resistive material 124 (not shown in FIGS. 1B-1E). In some embodiments, trench conductor layer 134 can be formed protruding into layer of dielectric material 126 and separating from layer of resistive material 124 by layer of dielectric material 126 (not shown in FIGS. 1B-1E). Trench conductor layer 134 can be made of any conductive materials suitable for RRAM structure 125. In some embodiments, trench conductor layer 134 can include a barrier liner layer 134A and a conductor layer 134B. In some embodiments, barrier liner layer 134A can include a metallic material (e.g., Ta or TiW), a metal oxide (e.g., alumina, manganese oxide, chromium oxide, niobium oxide, titanium oxide, or combinations thereof), a metal nitride (e.g., TaN or TiN), a metal compound (e.g., alumina, manganese oxide, chromium oxide, niobium oxide, titanium oxide, and/or combinations thereof), a carbon containing material, or combinations thereof. In some embodiments, conductor layer 134B can include Cu, Co, Ni, Ru, Rh, Ir, Os, Al, In, Ag, Au, W, or carbon nanotubes. In some embodiments, trench conductor layer 134 and trench conductor layer 128 can be made of same conductive materials. For example, barrier liner layer 134A and a conductor layer 134B can be respectively made of same materials as barrier liner layer 128A and a conductor layer 128B. In some embodiments, barrier liner layer 134A and barrier liner layer 128A can have substantially equal thicknesses to each other. Trench conductor layer 134 can have any suitable average horizontal dimension (e.g., width in the x-direction) based on a pitch size of FET 102. For example, trench conductor layer 134 can have an average horizontal dimension (e.g., width in the x-direction or in the y-direction) in a range from about 15 nm to about 50 nm Trench conductor layer 134 can have any suitable average vertical dimension (e.g., height in the z-direction) based on layer of dielectric material 126's thickness, such as from about 50 nm to about 600 nm. In some embodiments, trench conductor layer 134 can have a substantially equal average horizontal dimension (e.g., width in the x-direction) with trench conductor layer $130_1$. Based on the disclosure herein, other materials, thicknesses, and dimensions for trench conductor layer 134 are within the spirit and scope of this disclosure.

Trench conductor layer 132 can be vertically (e.g., in the z-direction) extending through layer of dielectric material 126 and layer of resistive material 124 to contact the underlying trench conductor layer $130_2$. In some embodiments, trench conductor layer 132 can electrically connect trench conductor layer $130_2$ (e.g., FET 102's S/D contact structure) to interconnect structure 140. Accordingly, trench conductor layer 132 together with trench conductor layer $130_2$ can electrically bridge interconnect structure 140 and the S/D region 110 underlying trench conductor layer $130_2$. In some embodiments, trench conductor layer 132 can protrude into the underlying trench conductor layer $130_2$. Hence, trench conductor layer $130_2$'s top surface $130_T$ can be under layer of resistive material 124, and trench conductor layer $130_1$'s top surface $130_T$ can be substantially coplanar layer of resistive material 124's bottom surface. In some embodiments, trench conductor layer 132 can protrude into the underlying trench conductor layer $130_2$, where trench conductor layer 132's bottom surface $132_s$, interfaced with trench conductor layer $130_2$'s top surface $130_T$, can be a curved or warped surface. The curved or warped bottom surface $132_s$ can increase a contact area between trench conductor layer 132 and trench conductor layer $130_2$, thus reducing FET 102's contact resistance. Trench conductor layer 132 can have any suitable horizontal dimension (e.g., width in the x-direction) and any suitable vertical dimension (e.g., height in the z-direction) based on a pitch size of FET 102. For example, trench conductor layer 132 can have an average horizontal dimension (e.g., width in the x-direction) in a range from about 15 nm to about 50 nm and can have an average vertical dimension (e.g., height in the z-direction) in a range from about 100 nm to about 600 nm. In some embodiments, trench conductor layer 132 can have an aspect ratio (e.g., a ratio of height in the z-direction to width in the x-direction) greater than about 1, greater than about 3, or greater than about 5 based on a pitch size of FET 102. Trench conductor layer 132's top surface can be higher (e.g., in the z-direction) than trench conductor layer 134's bottom surface with respect to S/D regions 110. For example, trench conductor layer 132's top surface can be higher (e.g., in the z-direction) than trench conductor layer 134's bottom surface with respect to S/D regions 110 and/or with respect to gate structure 112's top surface $112_s$. In some embodiments, trench conductor layer 132's top surface can be substantially coplanar with trench conductor layer 134's top surface. Trench conductor layer 132 can be made of any suitable conductive materials, such as W, Al, Cu, Co, Ti, Ta, Ru, Mo, a silicide material, and a conductive nitride material. In some embodiments, trench conductor layer 132 can be free from a conductive nitride material. In some embodiments, trench conductor layer 132 can include one or more layers of conductive material (not shown in FIGS. 1B-1E), where each of the one or more layers of conductive material can contact layer of resistive material 124 and/or layer of dielectric material 126 (e.g., trench conductor layer 132 does not have liner structure). Based on the disclosure herein, other materials and dimensions for trench conductor layer 132 are within the spirit and scope of this disclosure.

Interconnect structure 140 can provide metal wire routings for the underlying FETs 102 and RRAM structure 125. Interconnect structure 140 can include a layer of insulating material 144, a layer of conductive material 146 embedding in layer of insulating material 144, a layer of insulating material 148 disposed over layer of conductive material 146, and a trench conductor layer 162 formed through layer of insulating material 148 and in contact with layer of conductive material 146. Layer of conductive material 146 can be a lateral (e.g., in the x-y plane) routing for the interconnect structure 140. On the contrary, each of trench conductor layers 128, 130, 132, and 134 can be a vertical (e.g., in the z-direction) wire routing for contact structure 120, and trench conductor layer 162 can be a vertical (e.g., in the z-direction) wire routing for the interconnect structure 140. Accordingly, in some embodiments, an aspect ratio (e.g., a ratio of height to width) of layer of conductive material 146 can be less than that of each of trench conductor layers 128, 130, 132, 134, and 162. In some embodiments, a ratio of layer of conductor material 146's aspect ratio to each of trench conductor layers 128, 130, 132, 134, and 162's aspect ratio can be less than about 1, less than about 0.8, less than about 0.6, less than about 0.4, less than about 0.2, or less than about 0.1. If a ratio of layer of conductor material 146's aspect ratio to each of trench conductor layers 128, 130, 132, 134, and 162's aspect ratio is beyond the above-noted upper limits, interconnect structure 140 may not meet the fin pitch requirement determined by the respective technology node, thus failing the product requirement of the IC. Layer of conductive material 146 can be disposed over one or more of trench conductor layer 128, trench conductor layer 132, and trench conductor layer 134 to electrically connect to the underlying gate structure 112, S/D regions 110, and RRAM structure 125. Trench conductor layer 162 can electrically connect layer of conductive material 146 to another vertically (e.g., in the z-direction) above interconnect structures 140's layer of conductive material 146 (not shown in FIGS. 1B-1E). Layer of conductive material 146 and trench conductor layer 162 can be made of any suitable conductive material, such as W, Al, Cu, Co, Ti, Ta, Ru, Mo, a silicide material, and a conductive nitride material. Layer of insulating material 148 and layer of insulating material 144 can be made of a suitable dielectric material, such as silicon oxide, silicon nitride, silicon oxynitride, a low-k dielectric, and a high-k dielectric. Based on the disclosure herein, other materials for layer of conductive material 146, trench conductor layer 162, and layer of insulating material 144, and layer of insulating material 148 are within the spirit and scope of this disclosure.

Figure 1C:
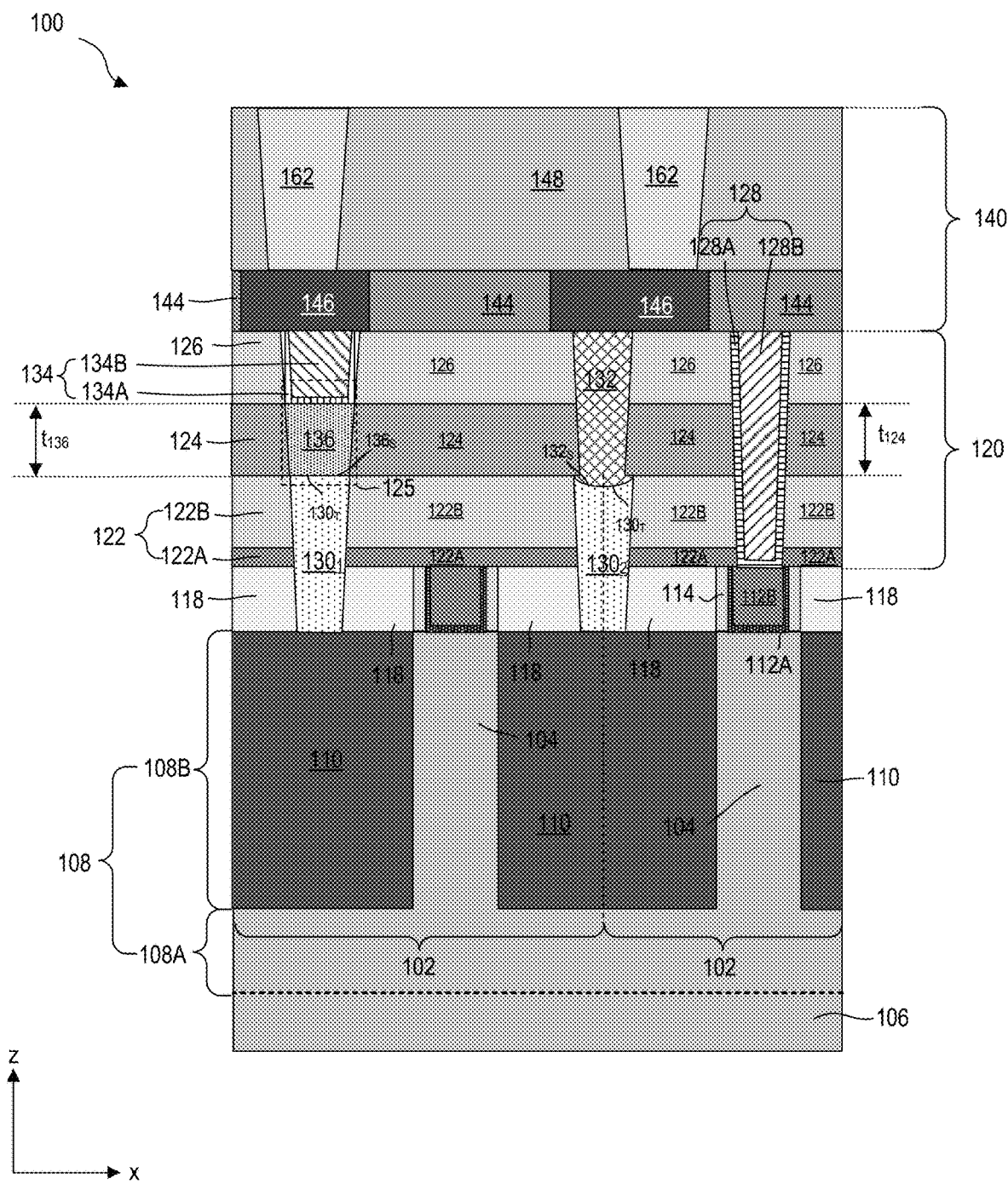

In some embodiments, referring to FIG. 1C, semiconductor device 100 can further include a layer of resistive material 136 sandwiched by trench conductor layer 134 and trench conductor layer $130_1$. Layer of resistive material 136 can be embedded in layer of resistive material 124 and horizontally (e.g., in the x-direction and/or in the y-direction) overlapped with trench conductor layer 134 and trench conductor layer $130_1$. As shown in FIG. 1C, layer of resistive material 136 can be formed through layer of resistive material 124 to contact trench conductor layer 134 and trench conductor layer $130_1$. Accordingly, layer of resistive material 136 can be the resistive film for RRAM structure 125 to store a bit of data (e.g., logic "0" or logic "1"). In some embodiments, layer of resistive material 136 can be formed closer to trench conductor layer 134 than trench conductor layer 132. In some embodiments, layer of resistive material 136 can be formed through layer of resistive material 124, where layer of resistive material 136's top surface and bottom surface can be substantially coplanar with layer of resistive material 124 and ILD layer 122. In some embodiments, layer of resistive material 136 can be formed through layer of resistive material 124, where layer of resistive material 136 can protrude in trench conductor layer 134 (not shown in FIG. 1C). In some embodiments, layer of resistive material 136's side surface can be substantially coplanar with layer of resistive material 124's side surface. Layer of resistive material 136 can include any resistive material suitable for RRAM structure 125, such as a silicon-based nitride material (e.g., silicon nitride or silicon oxynitride), a silicon-based oxide material (e.g., silicon oxide), a metal-based nitride material (e.g., TiN, zirconium nitride, hafnium nitride, aluminum nitride, gallium nitride, or indium nitirde), a metal-based oxide material (e.g., aluminum oxide, aluminum oxynitride, $HfO_2$, $TiO_2$, HfZrO, $Ta_2O_3$, $HfSiO_4$, $ZrO_2$, or $ZrSiO_2$), and a carbide material (e.g., silicon oxynitride carbide, silicon oxycarbide, silicon carbide, TaC, TiC, TiAlC, TaAlC, or TaCN). In some embodiments, layer of resistive material 136 can be made of a different resistive material from layer of resistive material 124. In some embodiments, layer of resistive material 136's thickness $t_{136}$ can be greater than or substantially equal to layer of resistive material 124's thickness $t_{124}$, where a vertical (e.g., in the z-direction) separation between trench conductor layer 134 and the underlying trench conductor layer $130_1$ can be from about 2 nm to about 30 nm or from about 5 nm to about 20 nm that is required by defining RRAM structure 125. Because if the separation between trench conductor layer 134 and the underlying trench conductor layer $130_1$ is below the above noted lower limits, RRAM structure 125 can exhibit an electrical breakdown that causes a leakage current. On the other hand, if the separation between trench conductor layer 134 and the underlying trench conductor layer $130_1$ is beyond the above noted upper limits, RRAM structure 125 can exhibit an undesirable high resistivity (e.g., greater than 500 μΩ·cm).

Figure 1D:
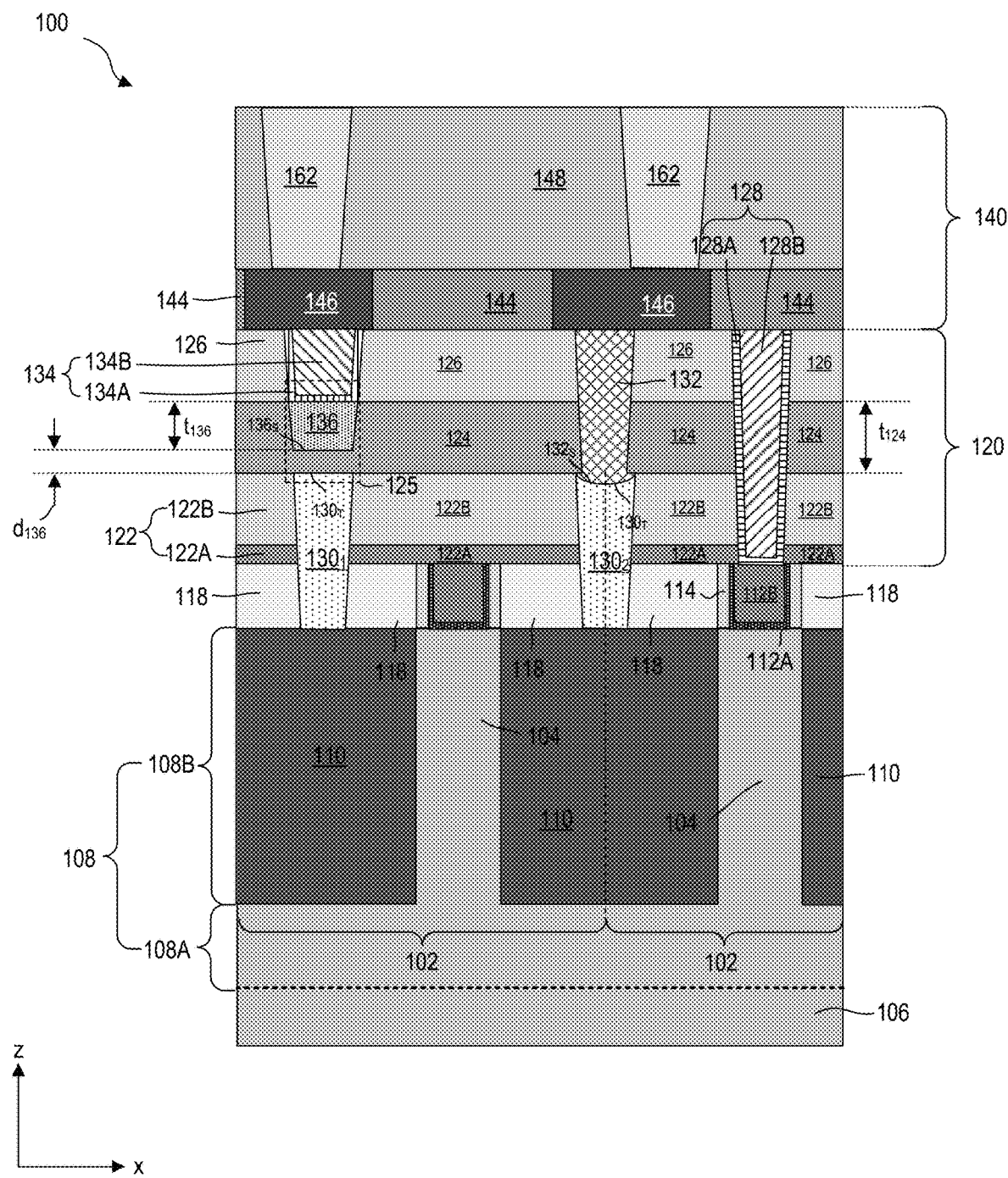

In some embodiments, referring to FIG. 1D, layer of resistive material 136 can be formed over layer of resistive material 124 and separated from trench conductor layer $130_1$ by layer of resistive material 124. For example, as shown in FIG. 1D, layer of resistive material 136 can protrude into layer of resistive material 124, where layer of resistive material 136's bottom surface $136_s$ can be separated from trench conductor layer $130_1$ by a vertical (e.g., in the z-direction) separation $d_{136}$ less than or substantially equal to layer of resistive material 124's thickness $t_{124}$. Accordingly, layer of resistive material 136 together with layer of resistive material 124 can be the resistive film for RRAM structure 125 to store a bit of data (e.g., logic "0" or logic "1"). In some embodiments, layer of resistive material 136 can protrude into layer of resistive material 124 and into trench conductor layer 134 (not shown in FIG. 1D). In some embodiments, layer of resistive material 136 can protrude into layer of resistive material 124 and separated from trench conductor layer $130_1$, where layer of resistive material 136's bottom surface $136_s$ can have an average horizontal dimension (e.g., width in the x-direction) greater than or substantially equal to the horizontal dimension (e.g., width in the x-direction) of trench conductor layer $130_1$'s top surface $130_T$ and less than or substantially equal to the horizontal dimension (e.g., width in the x-direction) of trench conductor layer 134's bottom surface. In some embodiments, layer of resistive material 136 can be formed over layer of resistive material 124 (not shown in FIG. 1D), where layer of resistive material 136's bottom surface $136_s$ can be substantially coplanar with or vertically (e.g., in the z-direction) above layer of resistive material 124, thus vertical separation $d_{136}$ being greater than or substantially equal to layer of resistive material 124's thickness $t_{124}$. In some embodiments, the summation of resistive material 136's thickness $t_{124}$ and vertical separation $d_{136}$ can be from about 2 nm to about 30 nm or from about 5 nm to about 20 nm that is suitable for RRAM structure 125. If the combination of resistive material 136's thickness $t_{124}$ and vertical separation $d_{136}$ is below the above noted lower limits, RRAM structure 125 can exhibit an electrical breakdown and an undesired leakage current. On the other hand, if the combination of resistive material 136's thickness $t_{124}$ and vertical separation $d_{136}$ is beyond the above noted upper limits, RRAM structure 125 can exhibit an undesirable high resistivity (e.g., greater than 500 μΩ·cm).

Figure 1E:
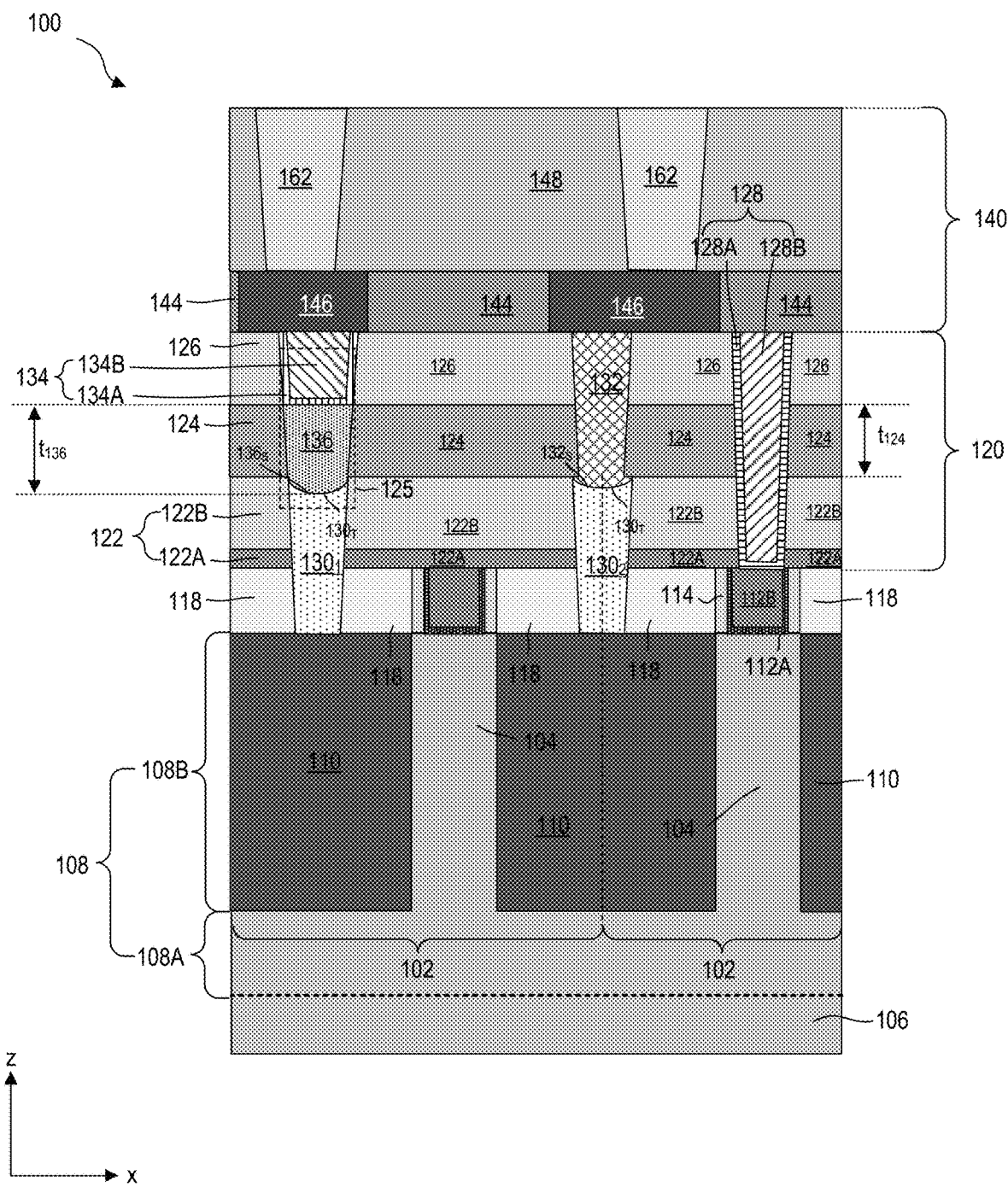
Figure 1F:
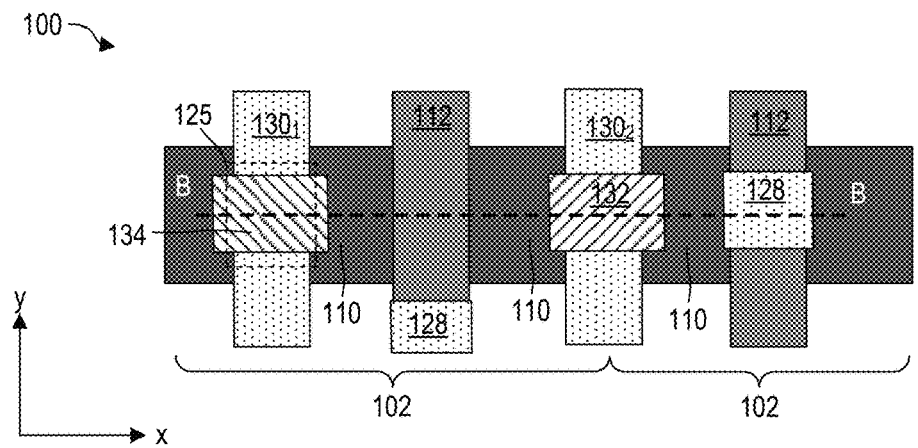
FIGS. 1F-1H illustrate top views of a semiconductor device, according to some embodiments.
Figure 1G:
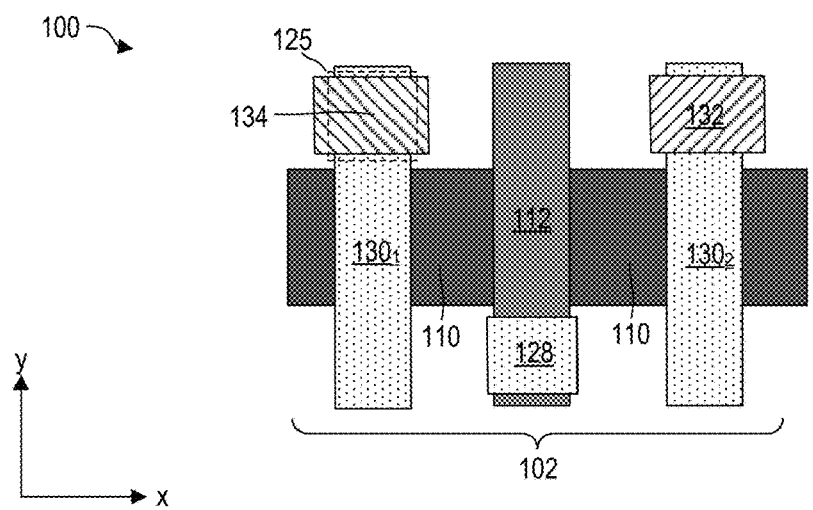
Figure 1H:
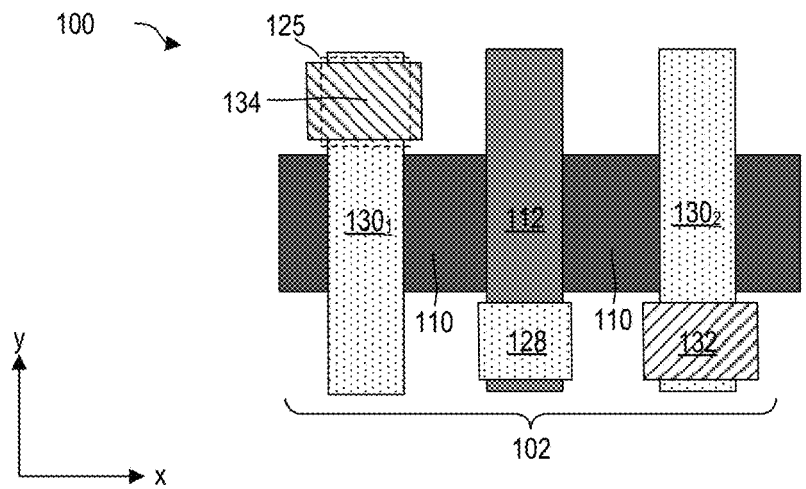

In some embodiments, referring to FIG. 1E, layer of resistive material 136 can be formed through layer of resistive material 124 and protruding into trench conductor layer $130_1$. For example, as shown in FIG. 1E, layer of resistive material 136 can be in contact with trench conductor layer 134, where layer of resistive material 136's bottom surface $136_s$ can be under layer of resistive material 124. Accordingly, layer of resistive material 136 together with layer of resistive material layer 124 can be the resistive film for RRAM structure 125 to store a bit of data (e.g., logic "0" or logic "1"). In some embodiments, a vertical (e.g., in the z-direction) separation between trench conductor layer 134 and the underlying trench conductor layer $130_1$ can be substantially equal to layer of resistive material 136's thickness $t_{136}$. In some embodiments, layer of resistive material 136's bottom surface $136_s$, interfaced with trench conductor layer $130_1$'s top surface $130_T$, can be a curved surface, a warped surface, or a substantially planar surface. In some embodiments, layer of resistive material 136 can protrude into trench conductor layer $130_1$ and into trench conductor layer 134 (not shown in FIG. 1E).

FIGS. 1F-1H illustrate layouts of FETs 102 and RRAM structure 125 on a x-y plane, according to some embodiments. Each of FIGS. 1F-1H shows placement of gate structure 112, S/D regions 110, trench conductor layer 130 (e.g., trench conductor layers $130_1$ and $130_2$), trench conductor layer 132, and trench conductor layer 134. For simplicity of illustration, some of semiconductor device 100's elements, such as gate spacer 114, layer of resistive material 124, layer of dielectric material 126, ILD layer 118, and interconnect structure 140, are not shown in FIGS. 1F-1H. As shown in FIGS. 1F-1H, trench conductor layers 130 (e.g., trench conductor layers $130_1$ and $130_2$) can traverse through fin structure 108 (e.g., traverse through S/D region 110) along a y-direction. Trench conductor layer 134 can be formed over trench conductor layer $130_1$. Trench conductor layer 132 can be formed over trench conductor layer $130_2$. Trench conductor layer 128 can be formed over gate structure 112. In some embodiments, trench conductor layers 134 and 132 can be formed at opposite sides of gate structure 112 in a horizontal (e.g., in the x-direction or in the y-direction) direction. In some embodiments, referring to FIG. 1F, both trench conductor layer 134 (e.g., RRAM structure 125) and trench conductor layer 132 can be disposed over fin structure 108 (e.g., disposed over S/D region 110). In some embodiments, FIG. 1F can represent a top view of structures of FIGS. 1A-1E. In some embodiments, referring to FIG. 1G, both trench conductor layer 134 (e.g., RRAM structure 125) and trench conductor layer 132 can be disposed over a same side of fin structure 108 (e.g., disposed over a same side of S/D regions 110). In some embodiments, referring to FIG. 1H, both trench conductor layer 134 (e.g., RRAM structure 125) and trench conductor layer 132 can be disposed over opposite sides of fin structure 108 (e.g., disposed over opposite sides of S/D regions 110).

Figure 2:
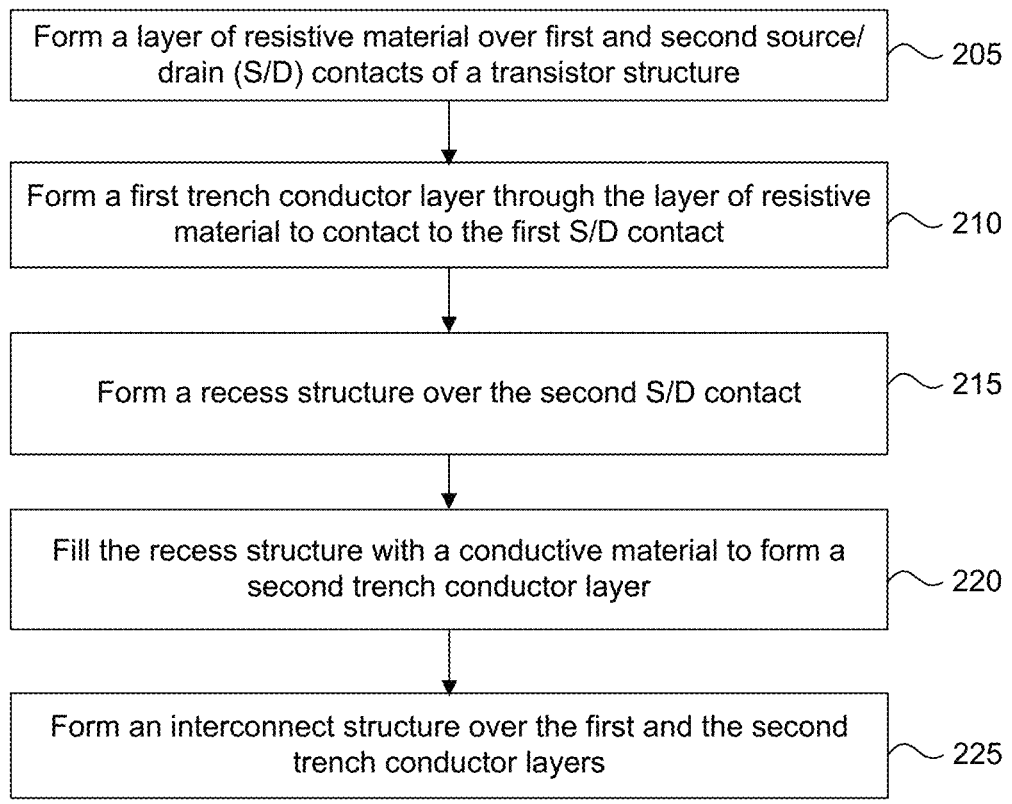
FIG. 2 is a flow diagram of a method for fabricating a semiconductor device, according to some embodiments.
Figure 3:
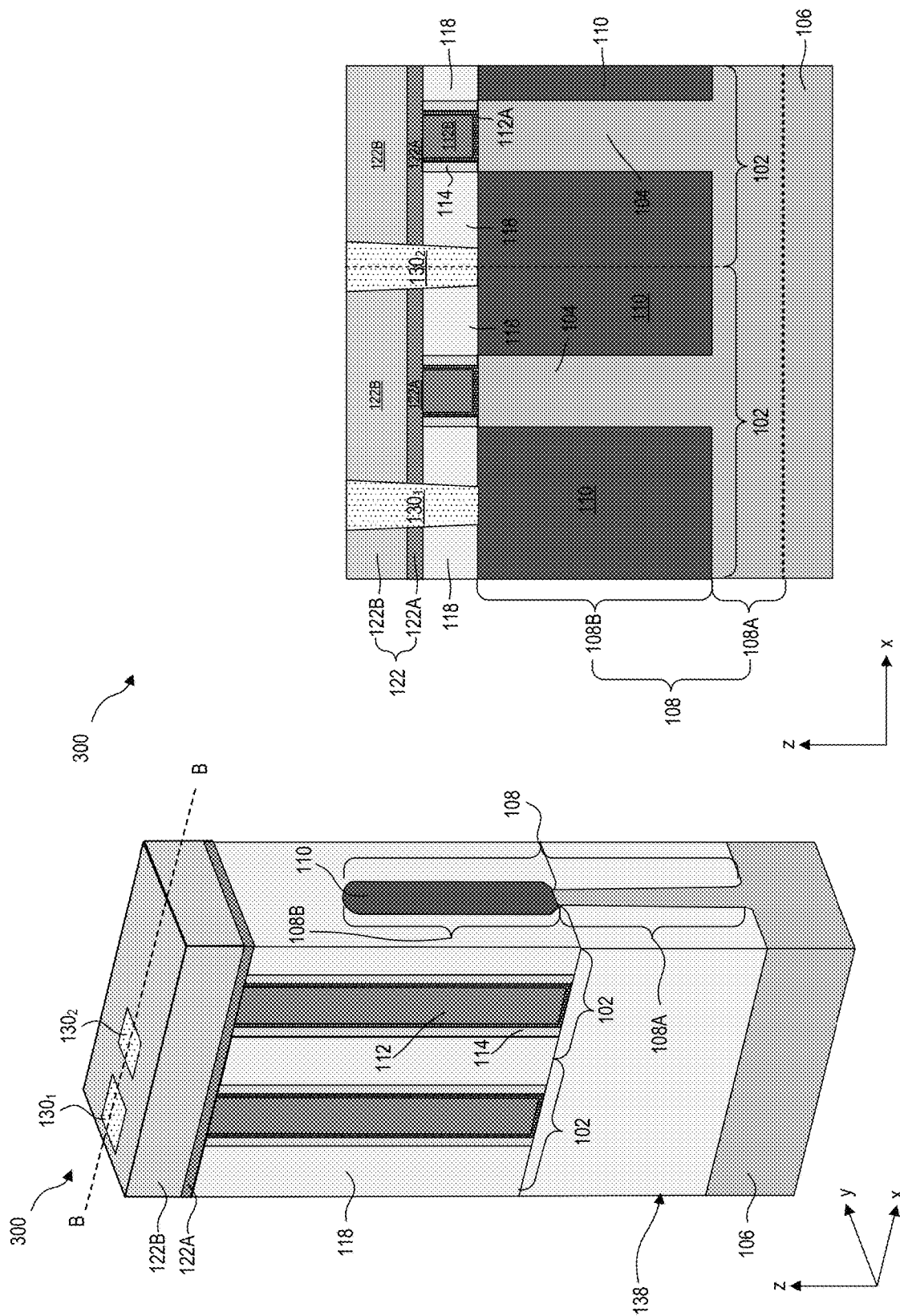
FIG. 3A illustrates an isometric view of a semiconductor device at a stage of its fabrication process, according to some embodiments.
FIGS. 3B, 4, 5, 6A-6D, 7, and 8 illustrate cross-sectional views of a semiconductor device at various stages of its fabrication process, according to some embodiments.

FIG. 2 is a flow diagram of an example method 200 for fabricating semiconductor device 100, according to some embodiments. For illustrative purposes, the operations illustrated in FIG. 2 will be described with reference to FIGS. 3A, 3B, 4, 5, 6A-6D, 7, and 8. FIG. 3A is an isometric view of semiconductor device 100 at various stages of its fabrication, according to some embodiments. FIGS. 3B, 4, 5, 6A-6D, 7, and 8 are cross-sectional views along line B-B of FIG. 3A at various stages of its fabrication to form semiconductor device 100, according to some embodiments (e.g., semiconductor devices 300-800 can represent stages of fabrication to form semiconductor device 100). Operations can be performed in a different order or not performed depending on specific applications. Method 200 may not produce a complete semiconductor device 100. Accordingly, it is understood that additional processes can be provided before, during, and after method 200, and that some other processes may only be briefly described herein. Further, the discussion of elements in FIGS. 1A-1H, 1B, 3A-3B, 4, 5, 6A-6D, 7, and 8 with the same annotations applies to each other, unless mentioned otherwise.

Figure 4:
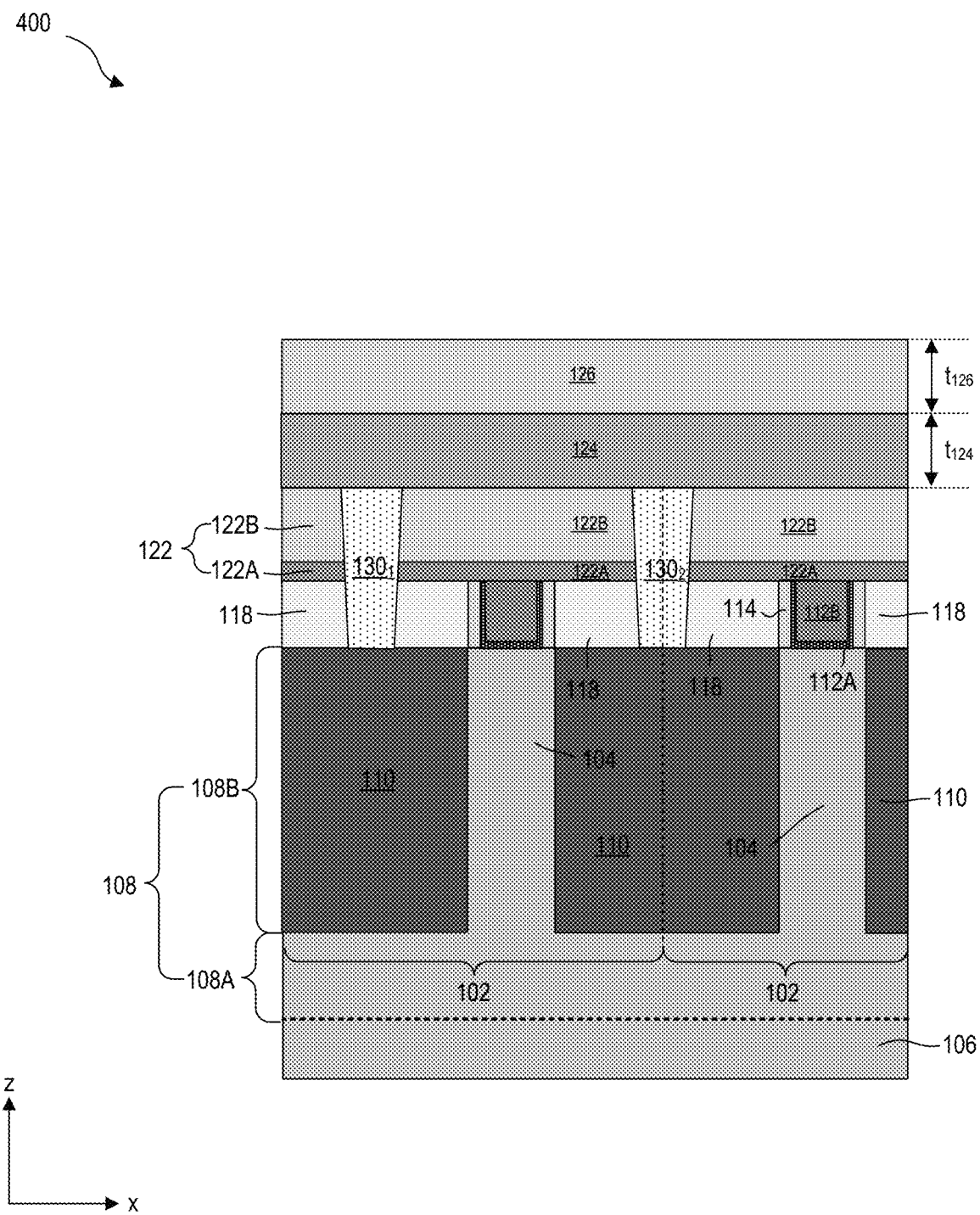

Referring to FIG. 2, in operation 205, a layer of resistive material is formed over first and second source/drain (S/D) contacts of a transistor structure. For example, FIG. 4 shows layer of resistive material 124 formed over FETs 102's trench conductor layers 130 (e.g., trench conductor layers $130_1$ and $130_2$) as described with reference to FIGS. 3A, 3B, and 4. In some embodiments, layer of resistive material 124 can be RRAM structure 125's resistive film (described at operation 220 below). A process of forming layer of resistive material 124 can include forming semiconductor device 300. Referring to FIGS. 3A and 3B, semiconductor device 300 can include fin structure 108 traversed by gate structures 112 and encapsulated by ILD layer 118 and ILD layer 122 (e.g., ESL 122A and layer of dielectric material 122B). In some embodiments, the process of forming semiconductor device 300 can include forming fin structure 108 on substrate 106, forming STI region 138 adjacent to fin structure 108, forming gate structure 112 traversing through fin structure 108, forming S/D regions 110, forming ILD layer 118 over a portion of fin structure 108 not covered by gate structure 112, and forming ILD layer 122 (e.g., ESL 122A and layer of dielectric material 122B) over gate structure 112 and ILD layer 118. The process of forming semiconductor device 300 can further include forming trench conductor layers 130 (e.g., trench conductor layers $130_1$ and $130_2$) through ILD layer 122 (e.g., ESL 122A and layer of dielectric material 122B) and ILD layer 118 to contact S/D regions 110. Based on the disclosure herein, other formation methods for semiconductor device 300 are within the spirit and scope of this disclosure.

Referring to FIG. 4, the process of forming layer of resistive material 124 can further include depositing layer of resistive material 124 with thickness $t_{124}$ over trench conductor layers 130 (e.g., trench conductor layers $130_1$ and $130_2$) and ILD layer 122 (e.g., layer of dielectric material 122B) using any suitable deposition process, such as a chemical vapor deposition (CVD) process, an atomic layer deposition (ALD) process, a physical vapor deposition (PVD) process, a plasma enhanced CVD (PECVD) process, and a spin-on process. In some embodiments, layer of resistive material 124 can be deposited using a deposition process, such as ALD, to result in thickness $t_{124}$ with a thickness variation (e.g., a ratio of a difference between the thickness's maximum and minimum to the thickness's average) less than about 0.1%, less than about 0.5%, less than about 1%, less than about 3%, or less than about 5% across substrate 106 to provide RRAM structures 125 having substantially identical resistive film thickness (e.g., thicknesses $t_{125}$) across substrate 106, where a diameter (not shown in FIGS. 3A, 3B, and 4) of substrate 106 can be greater than about 6 inches, greater than about 8 inches, or greater than about 12 inches. The process of forming layer of resistive material 124 can further include depositing a layer of dielectric material 126 with thickness $t_{126}$ disposed over layer of resistive material 124 using any suitable deposition process, such as a CVD process, an ALD process, a PVD process, a PECVD process, and a spin-on process. In some embodiments, layer of dielectric 126's thickness $t_{126}$ can be greater than or substantially equal to layer of resistive material 124's thickness $t_{124}$ due to the different etching selectivity between layer of dielectric material 126 and layer of resistive material 124.

Figure 5:
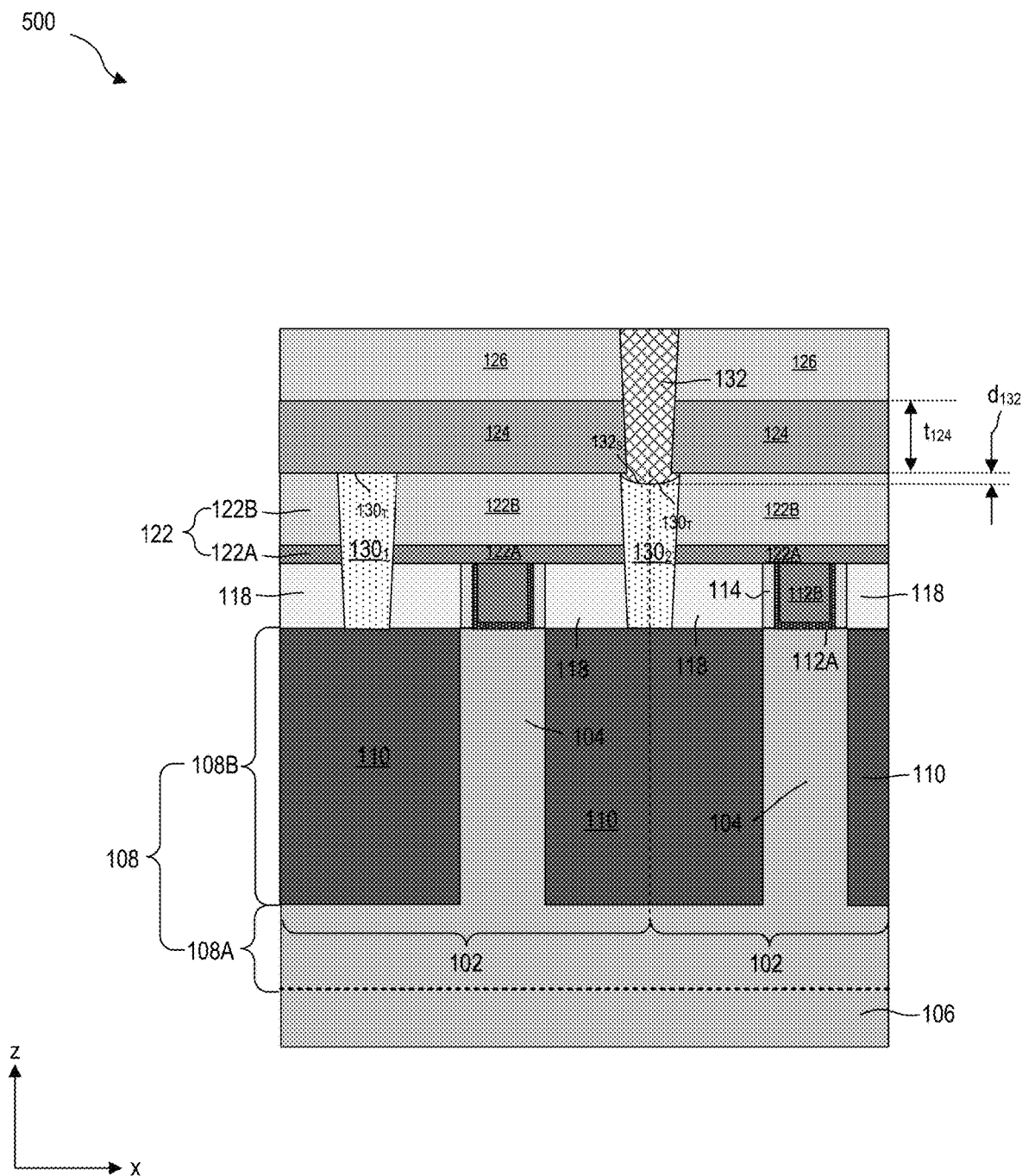

Referring to FIG. 2, in operation 210, a first trench conductor is formed through the layer of resistive material to contact the first S/D contact. For example, as shown in FIG. 5, trench conductor layer 132 can be formed through layer of resistive material 124 to contact the underlying trench conductor layer $130_2$. A process for forming trench conductor layer 132 can include (i) forming a recess structure (not shown in FIG. 5) through layer of dielectric material 126 and layer of resistive material 124 to expose the underlying trench conductor layer $130_2$; and (ii) filling a conductive material in the recess structure to contact trench conductor layer $130_2$.

The process of forming the recess structure to expose trench conductor layer $130_2$ can include patterning, using a lithography process, a mask layer (not shown in FIG. 5) to expose a portion of layer of dielectric material 126 that is over trench conductor layer $130_2$ and cover another portion of layer of dielectric material 126 that is over trench conductor layer $130_1$; and (ii) removing layer of dielectric material 126 and layer of resistive material 124 through the mask layer using an etching process, such as a dry etching process and a wet etching process, to expose trench conductor layer $130_2$. Accordingly, the recess structure can selectively expose trench conductor layer $130_2$'s top surface $130_T$ with trench conductor layer $130_1$'s top surface $130_T$ being buried under layer of resistive material 124. In some embodiments, the process of forming the recess structure can further include removing a top portion of layer of conductor layer $130_2$, using an etching process, to form a curved or warped trench conductor layer $130_2$'s top surface $130_T$ to increase an area of trench conductor layer $130_2$'s top surface $130_T$, thus reducing FET 102's contact resistance. In some embodiments, the curved or warped trench conductor layer $130_2$'s top surface $130_T$ can have a radius of curvature from about 1 nm to about 25 nm, from about 5 nm to about 25 nm, from about 5 nm to about 15 nm, or from about 1 nm to about 6 nm. The above noted radius of curvature's upper limit is at least to ensure that FET 102's contact resistance can be effectively reduced. The above noted radius of curvature's lower limit is at least to ensure trench conductor layer 132's conductive material can be effectively filled in the recess structure. In some embodiments, the curved or warped trench conductor layer $130_2$'s top surface $130_T$ can have a depth $d_{132}$ between layer of resistive material 124 and a bottommost portion of top surface $130_T$, where depth $d_{132}$ can be from about 1 nm to about 25 nm, from about 5 nm to about 25 nm, from about 5 nm to about 15 nm, or from about 1 nm to about 6 nm. The above noted $d_{132}$'s lower limit is at least to ensure that FET 102's contact resistance can be effectively reduced. The above noted depth $d_{132}$'s upper limit is at least to ensure trench conductor layer 132's conductive material can be effectively filled in the recess structure.

The process of filling the conductive material in the recess structure to contact trench conductor layer $130_2$ can include forming the conductive material over the recess structure that exposes trench conductor layer $130_2$, using a suitable blanket deposition process or a selective growth process. The blanket deposition process can include a CVD process, an ALD process, a PVD process, or an e-beam evaporation process. The selective growth process can include a CVD process, an ALD process, a plating process, or an electroless deposition (ELD) process that can selectively grow the conductive material over the exposed trench conductor layer $130_2$'s top surface $130_T$ (e.g., a surface formed with a conductive material). In some embodiments, the selective growth process can prohibit growing the conductive material over a dielectric surface, such as over layer of dielectric material 126's top surface. In some embodiments, the process of filling the conductive material in the recess structure to contact trench conductor layer $130_2$ can further include polishing the conductive material using a chemical mechanical polishing (CMP) process to form trench conductor layer 132 substantially coplanar with layer of dielectric material 126.

Figure 6A:
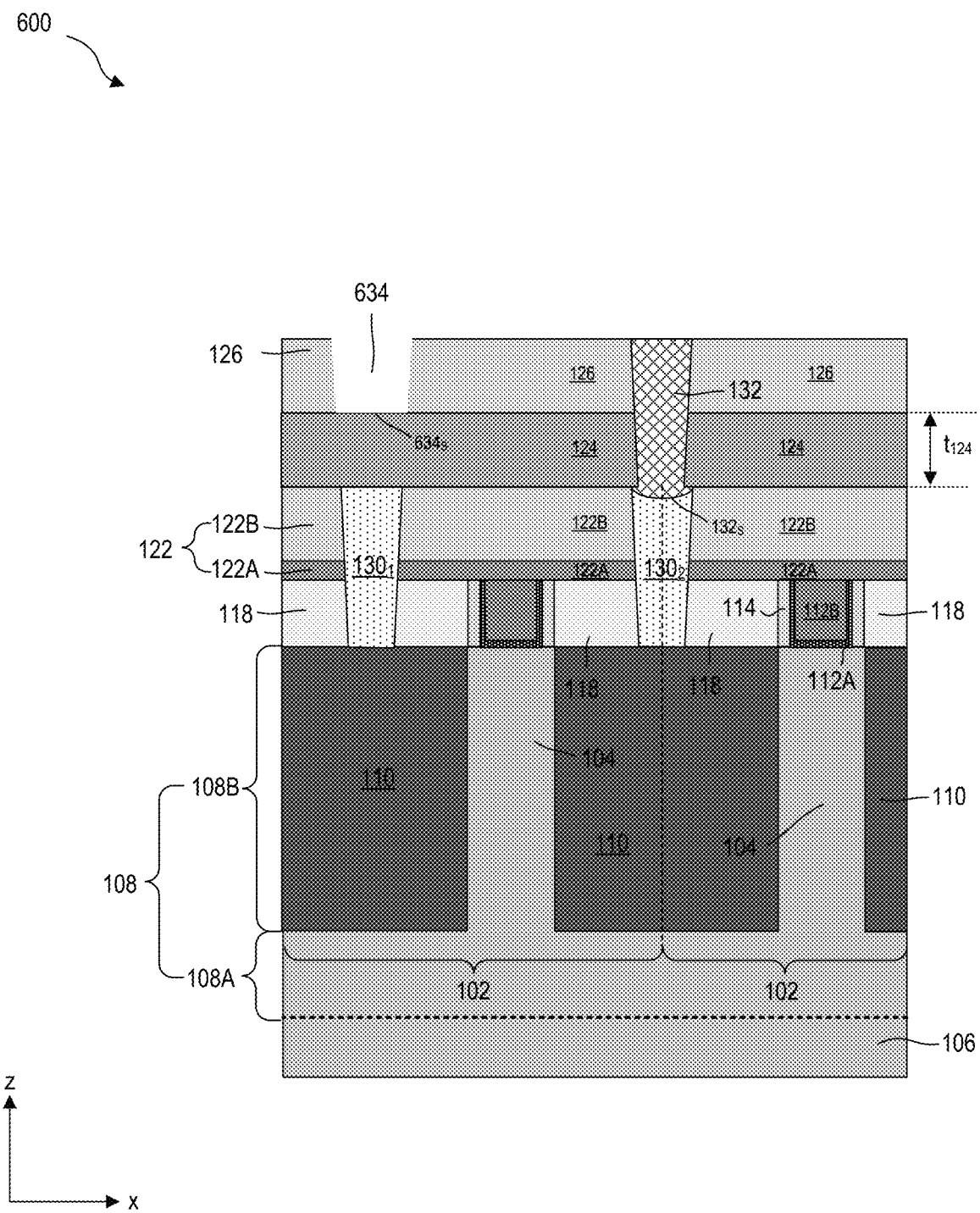
Figure 6B:
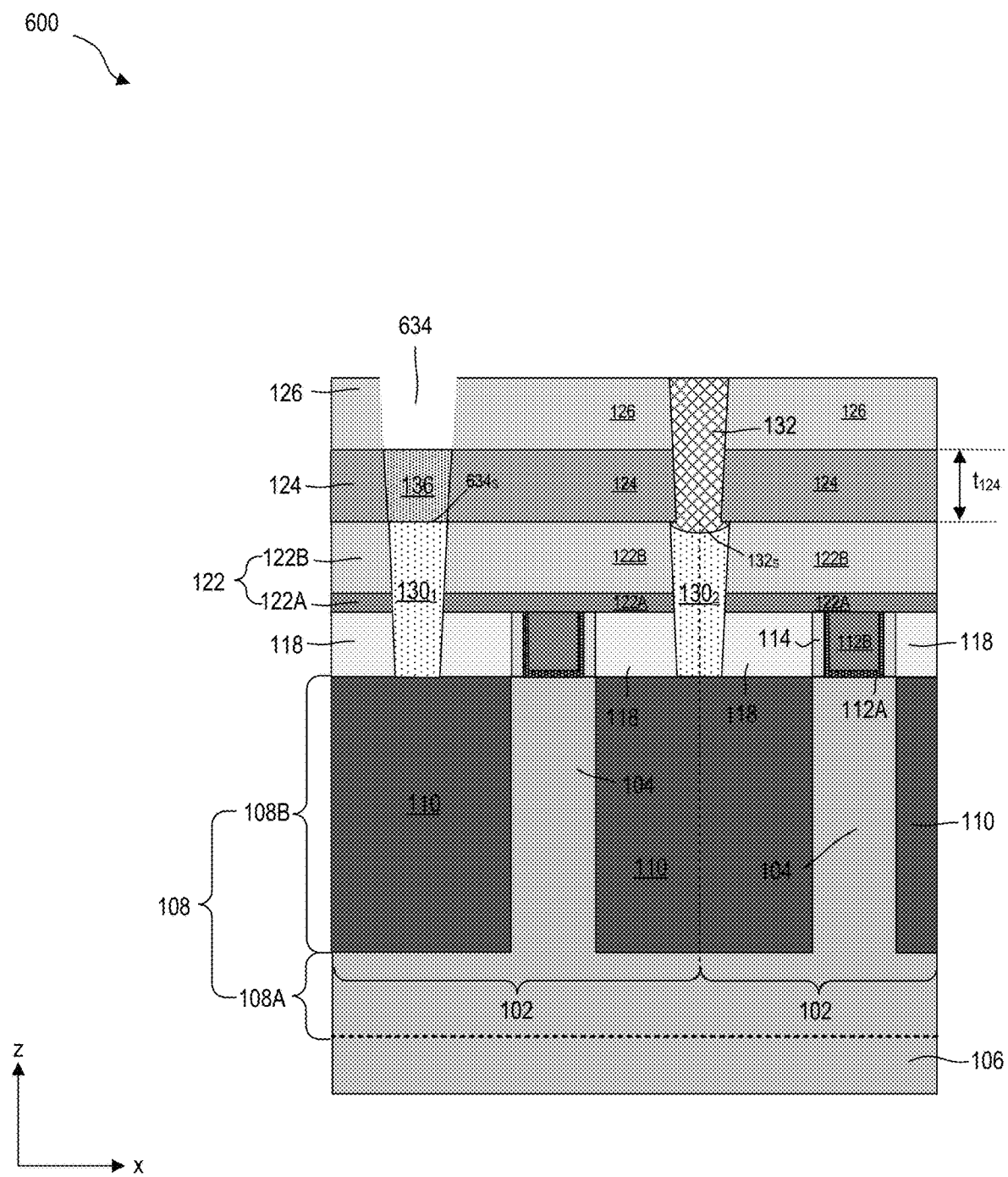
Figure 6C:
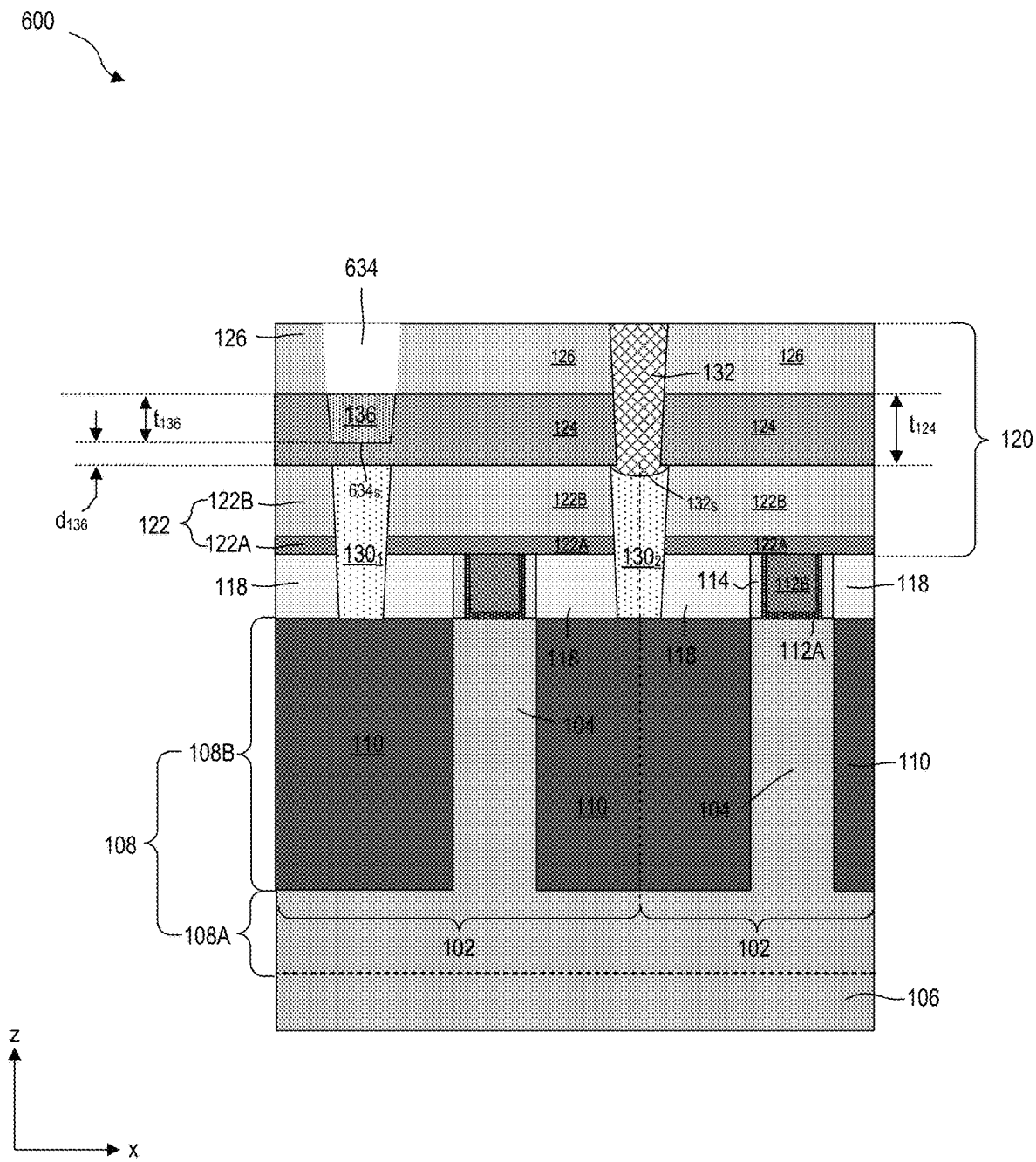
Figure 6D:
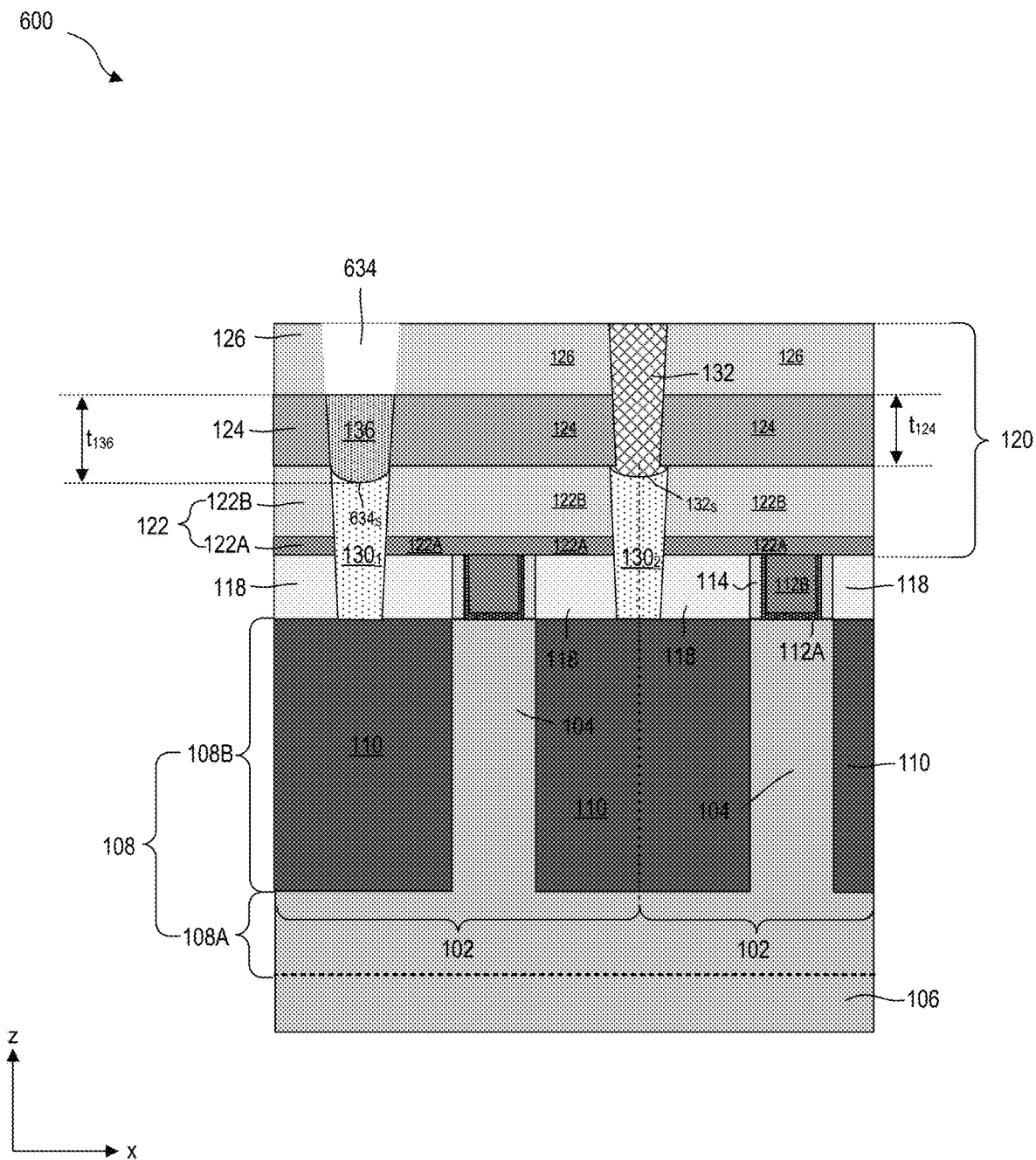

Referring to FIG. 2, in operation 215, a recess structure is formed over the second S/D contact. For example, as shown in FIG. 6A, recess structure 634 can be formed over trench conductor layer $130_1$ to expose layer of resistive material 124. In some embodiments, as shown in FIGS. 6B-6D, recess structure 634 can be formed over trench conductor layer $130_1$, and layer of resistive material 136 can be formed in recess structure 634. In some embodiments, layer of resistive material 136 can be RRAM structure 125's resistive film (described at operation 220 below). Referring to FIG. 6A, a process of forming recess structure 634 can include (i) patterning a mask layer (not shown in FIGS. 6A-6D), using a lithography process, to cover trench conductor layer 132 and expose a portion of layer of dielectric material 126 over trench conductor layer $130_1$ and (ii) removing layer of dielectric material 126, using an etching process, through the mask layer to form recess structure 634 that exposes layer of resistive material 124. Accordingly, the resulting recess structure 634 shown in FIG. 6A can have a bottom surface $634_b$ made of layer of resistive material 124.

The etching process for forming recess structure 634 can include a wet etching process, a dry etching process, or a combination thereof. In some embodiments, the wet etching process can include using a diluted hydrofluoric acid (DHF) treatment, an ammonium peroxide mixture (APM), a sulfuric peroxide mixture (SPM), hot deionized water (DI water), tetramethylammonium hydroxide (TMAH), or a combination thereof. In some embodiments, the dry etching process can include using a plasma dry etch associated with a gas mixture having octafluorocyclobutane ($C_4F_8$), fluoroform ($CHF_3$), carbon tetrafluoride ($CF_4$), difluoromethane ($CH_2F_2$), argon (Ar), nitrogen ($N_2$), oxygen ($O_2$), helium (He), chlorine ($Cl_2$), hydrogen bromide (HBr), or a combination thereof. In some embodiments, the etching process for forming recess structure 634 can be a selective etching process that etches layer of dielectric material 126 with an etching rate higher than another etching rate of etching layer of resistive material 124. In some embodiments, the etching process for forming recess structure 634 can be a selective etching process that etches layer of dielectric material 126 and substantially etch-stops on layer of resistive material 124. In some embodiments, structure of FIG. 6A can result in structure of FIG. 1B after operations 220 and 225 (discussed below).

In some embodiments, referring to FIG. 6B, operation 215 can further include removing layer of resistive material 124 to expose the underlying trench conductor layer $130_1$ using an etching process (e.g., extending recess structure 634 through layer of resistive material 124 to expose trench conductor layer $130_1$). Accordingly, the resulting recess structure 634 shown in FIG. 6B can have a bottom surface $634_s$ made of trench conductor layer $130_1$. In some embodiments, the etching process for forming recess structure 634 can include a selective etching process that etches layer of resistive material 124 and substantially etch-stops on trench conductor layer $130_1$. Operation 215 can further include (i) depositing a resistive material in recess structure 634 of FIG. 6B using a suitable deposition process, such as a CVD process, an ALD process, and a PVD process, (ii) etching back the deposited resistive material using an etch-back process, such as a dry etching process and a wet-etching process to form layer of resistive material 136 in recess structure 634 of FIG. 6B. In some embodiments, layer of resistive material 136's bottom surface $136_s$ (shown in FIG. 1C) can be substantially coplanar with recess structure 634's bottom surface $634_s$. In some embodiments, the etch-back process can form layer of resistive material 136 having a top surface substantially coplanar with layer of resistive material 124's top surface. In some embodiments, the etch-back process can form layer of resistive material 136 having a top surface vertically (e.g., in the z-direction) above or under layer of resistive material 124's top surface. In some embodiments, structure of FIG. 6B can result in structure of FIG. 1C after operations 220 and 225 (discussed below).

In some embodiments, referring to FIG. 6C, operation 215 can further include removing a portion layer of resistive material 124 with thickness $t_{136}$ less than layer of resistive material 124's total thickness $t_{124}$ using an etching process (e.g., protruding recess structure 634 into layer of resistive material 124 and separated from the underlying trench conductor layer $130_1$ by separation $d_{136}$). Accordingly, the resulting recess structure 634 shown in FIG. 6C can have sidewalls and bottom surface $634_s$ made of layer of resistive material 124. In some embodiments, the etching process for forming recess structure 634 can include a time-etch process with a pre-determined etching time. Operation 215 can further include (i) depositing a resistive material in recess structure 634 of FIG. 6C using a suitable deposition process, such as a CVD process, an ALD process, and a PVD process, (ii) etching back the deposited resistive material using an etch-back process, such as a dry etching process and a wet-etching process to form layer of resistive material 136 in recess structure 634 of FIG. 6C. In some embodiments, structure of FIG. 6C can result in structure of FIG. 1D after operations 220 and 225 (discussed below).

In some embodiments, referring to FIG. 6D, operation 215 can further include removing layer of resistive material 124 to protrude into the underlying trench conductor layer $130_1$ using an etching process (e.g., extending recess structure 634 through layer of resistive material 124 and protruding into trench conductor layer $130_1$). Accordingly, the resulting recess structure 634 shown in FIG. 6D can have a bottom surface $634_s$ made of trench conductor layer $130_1$. In some embodiments, bottom surface $634_s$ can be a curved or warped surface. Operation 215 can further include (i) depositing a resistive material in recess structure 634 of FIG. 6D using a suitable deposition process, such as a CVD process, an ALD process, and a PVD process, (ii) etching back the deposited resistive material using an etch-back process, such as a dry etching process and a wet-etching process to form layer of resistive material 136 in recess structure 634 of FIG. 6D. In some embodiments, structure of FIG. 6D can result in structure of FIG. 1E after operations 220 and 225 (discussed below).

Figure 7:
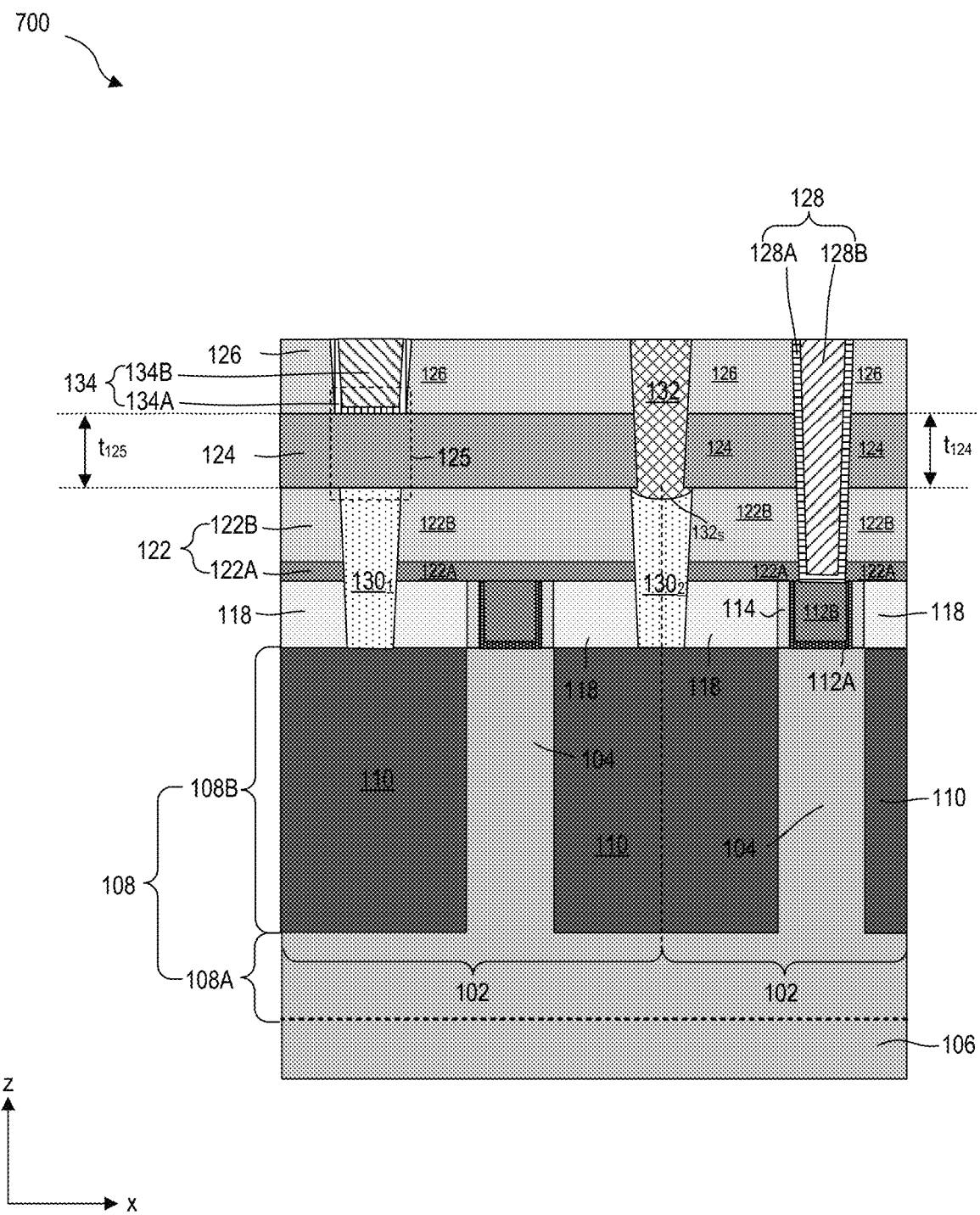

Referring to FIG. 2, in operation 220, the recess structure is filled with a conductive material to form a second trench conductor layer. Accordingly, RRAM structure can be defined by a layer of resistive material between the second S/D contact and the second trench conductor layer. For example, as shown in FIG. 7, a conductive material can be filled in recess structure 634 (shown in FIGS. 6A-6D) to form trench conductor layer 134 (e.g., barrier liner layer 134A and conductor layer 134B). Accordingly, trench conductor layer $130_2$ and trench conductor layer 134 can respectively be RRAM structure 125's bottom electrode and top electrode, where layer of resistive material 124 and/or layer of resistive material 136 can be RRAM structure 125's resistive film. The process of forming trench conductor layer 134 can include (i) blanket depositing a conductive material using a deposition process, such as a CVD process, an ALD process, and a plating process, and (ii) polishing the deposited conductive material (e.g., using CMP process) to be substantially coplanar with layer of dielectric material 126. In some embodiments, the process of forming trench conductor layer 134 can further include (i) forming a recess structure (not shown in FIG. 7) through layer of dielectric material 126, layer of resistive material 124, and ILD layer 122 to expose gate electrode 112B using a lithography process and an etching process, and (ii) depositing a conductive material in the recess structure to form trench conductor layer 128 (e.g., barrier liner layer 128A and conductor layer 128B) using a deposition process and a polishing process. In some embodiments, the process of forming the recess structure for trench conductor layer 128 can be performed prior to the deposition process for trench conductor layer 134. For example, the process of forming the recess structure for trench conductor layer 128 can include (i) forming a mask layer (not shown in FIG. 7) over recess structure 634 (shown in FIGS. 6A-6D) and over layer of dielectric 126, (ii) patterning, using a lithography process, the mask layer to expose a portion of layer of dielectric material 126 above gate electrode 112B while covering recess structure 634 with the mask layer, and (iii) removing layer of dielectric material 126, layer of resistive layer 124, and ILD layer 122 through the mask layer using an etching process. Accordingly, the subsequent deposition process for trench conductor layer 134 can be applied for depositing trench conductor layer 128, thus allowing trench conductor layer 134 being made of same materials and same layer stacks as trench conductor layer 128. In some embodiments, operation 220 can be performed to form trench conductor layers 134 in recess structures 634 of FIG. 6B-6D (not shown in FIG. 7 for simplicity illustration).

Figure 8:
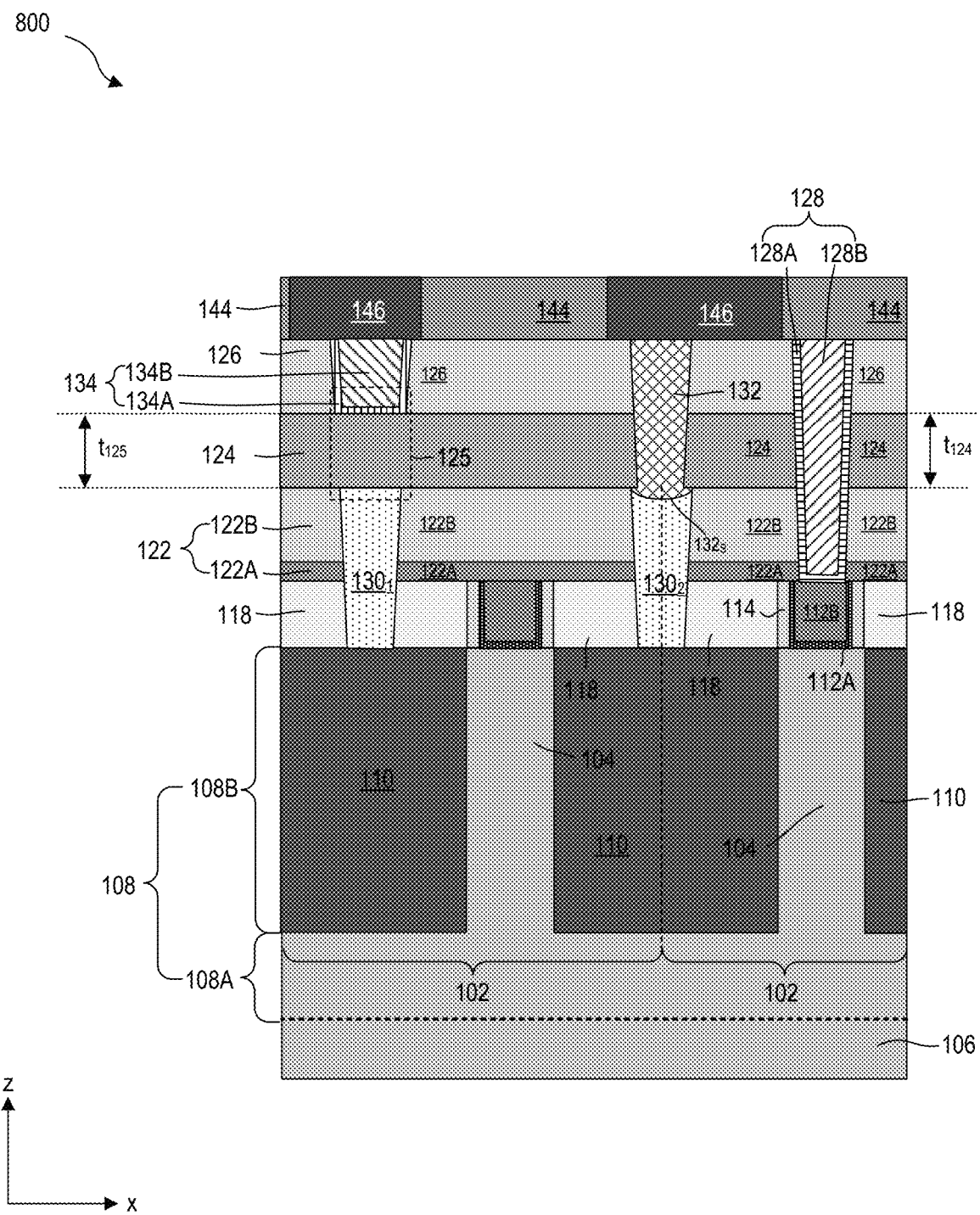

Referring to FIG. 2, in operation 225, an interconnect structure is formed over the first and second trench conductor layers. For example, as shown in FIGS. 1B-1E, interconnect structure 140 can be formed over trench conductor layers 134 and 128 as described in reference to FIGS. 8 and 1B-1E. Referring to FIG. 8, a process of forming interconnect structure 140 can include (i) forming a patterned layer of insulating material 144 over semiconductor device 700 of FIG. 7 to expose trench conductor layers 134 and 128 using a deposition process and an etching process, (ii) blanket depositing a conductive material over the patterned layer of insulating material 144 using a deposition process, and (iii) polishing the deposited conductive material using a CMP process to form layer of conductive material 146 substantially coplanar with layer of insulating material 144. The process of forming interconnect structure 140 can further include (i) blanket depositing layer of insulating material 148 over the structure of FIG. 8 using a deposition process, such as a CVD process, a PECVD process, a PVD process, and an ALD process, (ii) forming one or more recess structures (not shown in FIG. 8) through layer of insulating material 148 using a lithography process and an etching process, and (iii) filling the one or more recess structures with a conductive material to form trench conductor layers 162 (shown in FIGS. 1B-1E) using a deposition process (e.g., CVD, ALD, PVD, or e-beam evaporation) and a polishing process (e.g., a CMP process).

The present disclosure provides an embedded RRAM structure and a method for forming the same. The RRAM structure can be embedded (e.g., integrated) with a transistor structure. For example, the RRAM structure can be embedded in a contact layer that connects the transistor structure to an interconnect structure. The transistor structure can include a gate structure, first and second S/D structures formed at opposite sides of the gate structure, and first and second S/D contacts respectively formed over the first and second S/D structures. The contact layer can include an contact etch stop (CESL) layer for forming a via contact to connect the first S/D contact to the interconnect structure, where the RRAM structure can use the CESL layer as the resistive film to bridge the second S/D contact and the interconnect structure. Since the CESL layer can be formed by a blanket deposition process, the RRAM structure's resistive film thickness can be well-controlled. Accordingly, a benefit of the present disclosure, among others, is to provide the embedded RRAM structure with improved reliability without increasing the complexity of the transistor's fabrication process, thus enhancing an overall reliability and productivity of IC manufacturing.

In some embodiments, a semiconductor structure can include a substrate, a gate structure over the substrate, a source/drain (S/D) contact structure adjacent to the gate structure, a layer of dielectric material over the S/D contact structure, a conductor layer over and in contact with the layer of dielectric material and above the S/D contact structure, and an interconnect structure over and in contact with the conductor layer.

In some embodiments, a semiconductor structure can include a substrate and a gate structure over the substrate. The semiconductor structure can further include first and second source/drain (S/D) contact structures adjacent to first and second sides of the gate structure, respectively. The semiconductor structure can further include a layer of dielectric material over the first S/D contact structure, a first conductor layer over and in contact with the layer of dielectric material, a second conductor layer formed through the layer of dielectric material and in contact with the second S/D contact structure, and an interconnect structure formed over and in contact with the first and second conductor layers.

In some embodiments, a method for forming a semiconductor structure can include forming a gate structure over a substrate, and forming first and second source/drain (S/D) contact structures adjacent to first and second sides of the gate structure, respectively. The method can further include forming a layer of dielectric material over the first and second S/D contact structures, forming a first conductor layer over and separated from the first S/D contact structure and in contact with the layer of dielectric material, forming a second conductor layer through the layer of dielectric material and in contact with the second S/D contact structure, and forming an interconnect structure over and in contact with the first and second conductor layers.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a substrate;
    a gate structure over the substrate;
    a source/drain (S/D) contact structure adjacent to the gate structure;
    a layer of resistive material on the S/D contact structure, wherein a bottom surface of the layer of resistive material is curved or warped;
    a layer of dielectric material on the layer of resistive material;
    a conductor layer above the S/D contact structure, through the layer of dielectric material, and in contact with the layer of resistive material; and
    an interconnect structure over and in contact with the conductor layer.

2. The semiconductor structure of claim 1, wherein the layer of resistive material is in contact with the S/D contact structure.

3. The semiconductor structure of claim 1, wherein the interconnect structure comprises an other conductor layer and an other layer of dielectric material substantially coplanar with the other conductor layer, and wherein the other conductor layer is over and in contact with the conductor layer.

4. The semiconductor structure of claim 1, wherein a separation between the conductor layer and the S/D contact structure is from about 5 nm to about 20 nm.

5. The semiconductor structure of claim 1, wherein the layer of resistive material comprises a first resistive material and a second resistive material, wherein the first resistive material is proximate to the S/D contact structure, wherein the second resistive material is proximate to the conductor layer, and wherein the first resistive material is different from the second resistive material.

6. The semiconductor structure of claim 1, wherein the layer of resistive material comprises a first resistive material and a second resistive material, wherein the first resistive material is between the S/D contact structure and the conductor layer, wherein the second resistive material is adjacent to first and second sides of the first resistive material, and wherein the first resistive material is different from the second resistive material.

7. A semiconductor structure, comprising:
    a substrate;
    a gate structure over the substrate;

first and second source/drain (S/D) contact structures adjacent to first and second sides of the gate structure, respectively;
a first layer of resistive material on the first and second S/D contact structures;
a second layer of resistive material embedded in the first layer of resistive material, wherein top surfaces of the first and second layers of resistive material are coplanar;
a layer of dielectric material on the first layer of resistive material;
a first conductor layer over the first S/D contact structure, through the layer of dielectric material, and in contact with the second layer of resistive material;
a second conductor layer formed through the layer of dielectric material and the first layer of resistive material, and in contact with the second S/D contact structure; and
an interconnect structure formed over and in contact with the first and second conductor layers.

8. The semiconductor structure of claim 7, wherein a bottom surface of the first layer of resistive material is in contact with a top surface of the first S/D contact structure.

9. The semiconductor structure of claim 7, wherein the first and second conductor layers are substantially coplanar with each other.

10. The semiconductor structure of claim 7, wherein the substrate comprises a first S/D region and a second S/D region, and wherein the first and second S/D contact structures are in contact with the first and second S/D regions, respectively.

11. The semiconductor structure of claim 7, wherein a thickness of the second layer of resistive material is from about 5 nm to about 20 nm.

12. The semiconductor structure of claim 7, wherein the first and second layers of resistive material comprise a first resistive material and a second resistive material, respectively, wherein the first resistive material is different from the second resistive material.

13. A method for forming a semiconductor structure, comprising:
forming a gate structure over a substrate;
forming first and second source/drain (S/D) contact structures adjacent to first and second sides of the gate structure, respectively;
forming a layer of resistive material over the first and second S/D contact structures;
forming a layer of dielectric material on the layer of resistive material, wherein the layer of dielectric material is different from the layer of resistive material;
forming a recess structure in the layer of dielectric material over the first S/D contact structure;
depositing an other layer of resistive material in the recess structure;
forming a first conductor layer over the first S/D contact structure through the layer of dielectric material, and in contact with the other layer of resistive material;
forming a second conductor layer through the layer of dielectric material and the layer of resistive material, wherein the second conductor layer is in contact with the second S/D contact structure; and
forming an interconnect structure over and in contact with the first and second conductor layers.

14. The method of claim 13, wherein forming the other layer of resistive material comprises depositing the layer of resistive material with a thickness from about 5 nm to about 20 nm.

15. The method of claim 13, wherein forming the second conductor layer comprises selectively growing a layer of conductive material over the second S/D contact structure while exposing the layer of resistive material.

16. The method of claim 13, wherein forming the first conductor layer comprises forming a recess structure in the layer of dielectric material, wherein a bottom surface of the recess structure is separated from the first S/D contact structure.

17. The method of claim 13, wherein forming the interconnect structure comprises:
forming an other layer of dielectric material over the first and second conductor layers; and
forming other conductor layers through the other layer of dielectric material and in contact with the first and second conductor layers.

18. The semiconductor structure of claim 1, further comprising an other layer of resistive material in contact with the layer of resistive material, wherein top surfaces of the layer of resistive material and the other layer of resistive material are coplanar.

19. The semiconductor structure of claim 7, wherein a bottom surface of the second conductor layer is curved or warped.

20. The method of claim 13, wherein forming the recess structure comprises removing a portion of the first S/D contact structure to form a curved top surface of the first S/D contact structure.

* * * * *